United States Patent
Kim et al.

(10) Patent No.: US 11,495,764 B2
(45) Date of Patent: Nov. 8, 2022

(54) ELECTROLUMINESCENT DEVICE, AND DISPLAY DEVICE COMPRISING SAME

(71) Applicant: SAMSUNG ELECTRONICS CO., LTD., Suwon-si (KR)

(72) Inventors: Tae Ho Kim, Seongnam-si (KR); Moon Gyu Han, Suwon-si (KR); Hongkyu Seo, Anyang-si (KR); Heejae Lee, Seongnam-si (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 226 days.

(21) Appl. No.: 17/026,622

(22) Filed: Sep. 21, 2020

(65) Prior Publication Data
US 2021/0091327 A1    Mar. 25, 2021

(30) Foreign Application Priority Data
Sep. 20, 2019    (KR) .................. 10-2019-0116214

(51) Int. Cl.
*H01L 51/50* (2006.01)
*C09K 11/06* (2006.01)
*H01L 51/00* (2006.01)

(52) U.S. Cl.
CPC .......... *H01L 51/5004* (2013.01); *C09K 11/06* (2013.01); *H01L 51/502* (2013.01); *H01L 51/5076* (2013.01); *H01L 51/0035* (2013.01); *H01L 51/0037* (2013.01); *H01L 51/0039* (2013.01); *H01L 51/0072* (2013.01);
(Continued)

(58) Field of Classification Search
CPC .............. H01L 51/5004; H01L 51/502; H01L 51/5076; H01L 51/504
See application file for complete search history.

(56) References Cited

U.S. PATENT DOCUMENTS

| 8,330,142 B2 | 12/2012 | Cho et al. |
| 9,073,752 B2 | 7/2015 | Kang et al. |

(Continued)

FOREIGN PATENT DOCUMENTS

| JP | 5828340 B2 | 12/2015 |
| JP | 6168372 B2 | 7/2017 |

(Continued)

OTHER PUBLICATIONS

Wan Ki Bae, et al., Multicolored Light-Emitting Diodes Based on All-Quantum-Dot Multilayer Films Using Layer-by-Layer Assembly Method, Nano Letters, 2010, 10, 72368-2373.
(Continued)

*Primary Examiner* — Anthony Ho
(74) *Attorney, Agent, or Firm* — Cantor Colburn LLP

(57) ABSTRACT

An electroluminescent device and a display device including the same are disclosed, wherein the electroluminescent device includes a first electrode; a hole transport layer disposed on the first electrode; a light emitting layer including a first light emitting layer disposed on the hole transport layer, the first emitting layer including a first quantum dot, and a second light emitting layer including a second quantum dot and an n-type organic semiconductor, the second light emitting layer disposed on the first light emitting layer; an electron transport layer disposed on the second light emitting layer; and a second electrode disposed on the electron transport layer.

24 Claims, 4 Drawing Sheets
(2 of 4 Drawing Sheet(s) Filed in Color)

(52) U.S. Cl.
CPC ...... *H01L 51/504* (2013.01); *H01L 2251/303* (2013.01); *H01L 2251/552* (2013.01); *H01L 2251/558* (2013.01)

(56) References Cited

U.S. PATENT DOCUMENTS

| | | |
|---|---|---|
| 9,419,174 B2 | 8/2016 | Zheng et al. |
| 9,698,354 B2 | 7/2017 | Seo et al. |
| 9,722,198 B2 | 8/2017 | Murayama et al. |
| 9,768,404 B1 | 9/2017 | Steckel et al. |
| 2013/0056705 A1 | 3/2013 | Kim et al. |
| 2016/0240730 A1 | 8/2016 | Murayama et al. |
| 2017/0294617 A1 | 10/2017 | Seo et al. |
| 2018/0019371 A1 | 1/2018 | Steckel et al. |
| 2019/0088897 A1 | 3/2019 | Seo et al. |

FOREIGN PATENT DOCUMENTS

| | | |
|---|---|---|
| JP | 6233417 B2 | 11/2017 |
| JP | 2019033005 A | 2/2019 |
| KR | 20100095875 A | 9/2010 |
| KR | 20110127897 A | 11/2011 |
| KR | 1108213 B1 | 1/2012 |
| KR | 1140309 B1 | 4/2012 |
| KR | 101489776 B1 | 2/2015 |
| KR | 1686104 B1 | 12/2016 |
| KR | 20170078583 A | 7/2017 |

OTHER PUBLICATIONS

Extended European Search Report dated Jan. 28, 2021, of the corresponding European Patent Application No. 20196965.6.
Office Action dated Jan. 26, 2022 issued in corresponding European Patent Application No. 20196965.6.

ELECTROLUMINESCENT DEVICE, AND DISPLAY DEVICE COMPRISING SAME

CROSS-REFERENCE TO RELATED APPLICATION

This application claims priority to Korean Patent Application No. 10-2019-0116214 filed in the Korean Intellectual Property Office on Sep. 20, 2019, and all benefits accruing therefrom under 35 U.S.C. § 119, the entire content of which is incorporated herein by reference.

BACKGROUND

1. Field

An electroluminescent device and a display device comprising the same are disclosed.

2. Description of the Related Art

Quantum dots are materials that exhibit quantum confinement effects as nanocrystals of semiconductor materials having diameters of several nanometers to several tens of nanometers. Quantum dots emit light in a relatively narrow wavelength region compared to commonly used light emitting phosphors. Quantum dots emit light when the excited electrons transition from a conduction band to a valence band, and the wavelength of the emitted light depends upon a particle size of the quantum dots, even in a material of the same chemical composition. Generally, quantum dots will emit light of a shorter wavelength at a smaller particle size, thus the quantum dots may provide light in a desired wavelength region by adjusting the particle size.

A light emitting layer including quantum dots, and various types of electronic devices including the light emitting layer may generally have reduced production costs compared to an organic light emitting diode that has a light emitting layer that includes a phosphorescent and/or fluorescent material. Moreover, desirable colors (or the wavelength of emitted light) can be controlled with a change in the particle size of the quantum dots, and in most instances, without using other light emitting organic materials in the light emitting layer.

Luminous efficiency of the light emitting layer including quantum dots is determined by a quantum efficiency of the quantum dots, an appropriate balance of charge carriers, light extraction efficiency, and the like. Particularly, in order to improve the quantum efficiency, excitons may be confined to the light emitting layer, but when the excitons are not so confined due to a variety of factors this can lead to a problem such as exciton quenching and consequent reduction in the luminous efficiency of the light emitting layer.

SUMMARY

An electroluminescent device having improved luminous efficiency and life-span, and a display device including the electroluminescent device are provided.

According to an embodiment, an electroluminescent device includes a first electrode; a hole transport layer disposed on the first electrode; a light emitting layer including a first light emitting layer disposed on the hole transport layer, the first light emitting layer including a first quantum dot, and a second light emitting layer including a second quantum dot and an n-type organic semiconductor, the second light emitting layer disposed on the first light emitting layer; an electron transport layer disposed on the second light emitting layer; and a second electrode disposed on the electron transport layer.

A HOMO (highest occupied molecular orbital) energy level of the n-type organic semiconductor may be less than or equal to about −7.0 electron Volts (eV).

The n-type organic semiconductor may be an n-type monomolecular organic semiconductor, an n-type polymer organic semiconductor, or a combination thereof.

The n-type monomolecular organic semiconductor may include 1,3,5-tri(diphenylphosphoryl-phen-3-yl) benzene, 1,3,5-triazine-2,4,6-triyl)tris(benzene-3,1-diyl)tris(diphenylphosphine oxide), diphenylbis(4-(pyridin-3-yl)phenyl)silane, 3-(4-biphenyl)-4-phenyl-5-tert-butylphenyl-1,2,4-triazole, 4-(naphthalen-1-yl)-3,5-diphenyl-4H-1,2,4-triazole, 1,3,5-tris(1-phenyl-1Hbenzimidazol-2-yl)benzene, 4,7-diphenyl-1,10-phenanthroline, 1,3-bis[2-(2,2'-bipyridin-6-yl)-1,3,4-oxadiazol-5-yl]benzene, 2-(4-biphenyl)-5-(4-tert-butylphenyl)-1,3,4-oxadiazole, bathocuproine, 4,4'-bis (carbazol-9-yl)-2,2'-dimethylbiphenyl, tris[3-(3-pyridyl)-mesityl]borane, or a combination thereof.

The n-type organic semiconductor may be present the second light emitting layer in an amount of greater than 0 weight percent (wt %) and less than or equal to about 0.5 wt % based on a total weight of the second light emitting layer.

The first light emitting layer may further include a p-type organic semiconductor.

A LUMO (lowest unoccupied molecular orbital) energy level of the p-type organic semiconductor may be greater than or equal to about −3.0 eV.

The p-type organic semiconductor may include a p-type monomolecular organic semiconductor.

The p-type monomolecular organic semiconductor may include tris(4-carbazol-9-yl phenyl)amine, N,N'-bis(3-methylphenyl)-N,N'-diphenylbenzidine, N,N'-bis(3-methylphenyl)-N,N'-bis(phenyl)-2,7-diamino-9,9-spirobifluorene, N,N'-bis(3-methylphenyl)-N,N'-bis(phenyl)-9,9-dioctylfluorene, N,N'-bis(3-methylphenyl)-N,N'-bis(phenyl)-2,7-diamino-9,9-diphenyl-fluorene, N,N'-bis(3-methylphenyl)-N,N'-bis(phenyl)-2,7-diamino-9,9-dimethyl-fluorene, N1,N1'-(biphenyl-4,4'-diyl)bis(N1-phenyl-N4,N4-di-m-tolylbenzene-1,4-diamine), N,N,N',N'-tetra-(3-methylphenyl)-3,3'-dimethylbenzidine, N,N'-di(naphthalen-1-yl)-N—N'-diphenyl-benzidine, N2,N7-di(naphthalen-1-yl)-9,9-dioctyl-N2,N7-diphenyl-9H-fluorene-2,7-diamine, N,N'-bis (naphthalen-1-yl)-N,N'-bis(phenyl)-2,7-diamino-9,9-spirobifluorene, 2,2',7,7'-tetrakis[N-naphthalenyl(phenyl)-amino]-9,9-spirobifluorene, tris(3-methylphenylphenylamino)-triphenylamine, dipyrazino[2,3-f:2',3'-h]quinoxaline-2,3,6,7,10,11-hexacarbonitrile, di-[4-(N,N-di-p-tolyl-amino)-phenyl]cyclohexane, N,N'-(4,4'-(cyclohexane-1,1-diyl)bis(4,1-phenylene))bis(N-(4-(6-(2-ethyloxetan-2-yl oxy)hexyl)phenyl)-3,4,5-trifluoroaniline), 4,4'-bis(N-carbazolyl)-1,1'-biphenyl, 2,6-bis(3-(9H-carbazol-9-yl)phenyl)pyridine, or a combination thereof.

The p-type organic semiconductor may be present in the first emitting layer in an amount of greater than 0 wt % and less than or equal to about 1 wt % based on a total weight of the first light emitting layer.

The light emitting layer may have a thickness of about 10 nanometers (nm) to about 60 nm.

At least one of the first quantum dot or the second quantum dot may include a core including a first semiconductor nanocrystal and a shell disposed on the core, the shell including a second semiconductor nanocrystal, and the second semiconductor nanocrystal has a composition different from the first semiconductor nanocrystal.

The first semiconductor nanocrystal and the second semiconductor nanocrystal may independently include a Group II-VI compound that does not include Cd, a Group III-V compound, a Group IV-VI compound, a Group IV element or compound, a Group compound, a Group I-II-IV-VI compound that does not include Cd, or a combination thereof.

A ligand derived from a compound including a metal halide, a compound including a carboxylic acid, a compound including thiol, or a combination thereof may be attached to a surface of at least one of the first quantum dot or the second quantum dot.

In an embodiment, the surface of the first quantum dot comprises ligands derived from a compound including the metal halide, and additional ligands derived from the compound comprising the carboxylic acid, the compound comprising the thiol, or a combination thereof, wherein a weight of the ligands derived from the compound including the metal halide relative to a total weight of ligands attached to the surface of the first quantum dot may be about 10 percent % to about 40 percent.

A ligand derived from a compound including a carboxylic acid, a compound including thiol, or a combination thereof may be attached to a surface of the second quantum dot, wherein a weight of the ligand derived from the compound including the carboxylic acid, the compound including a thiol, or the combination thereof, of a total weight of ligands attached to the surface of the second quantum dot may be greater than or equal to about 80 percent.

The hole transport layer may include a poly(3,4-ethylenedioxythiophene) derivative, a poly(styrenesulfonate) derivative, a poly-N-vinylcarbazole derivative, a polyphenylenevinylene derivative, a polyparaphenylenevinylene derivative, a polymethacrylate derivative, a polyarylamine derivative, a polyaniline derivative, a polypyrrole derivative, a poly(9,9-dioctylfluorene) derivative, a poly(spiro-bifluorene) derivative, a tris(4-carbazol-9-yl phenyl)amine, N,N'-diphenyl-N,N'-bis(3-methylphenyl)-(1,1'-biphenyl)-4,4'-diamine, N,N'-di(naphthalen-1-yl)-N—N'-diphenyl-benzidine, tris(3-methylphenylphenylamino)-triphenylamine, poly(N,N'-diphenyl-N,N'-bis(3-methylphenyl)-(1,1'-biphenyl)-4,4'-diamine), NiO, $MoO_3$, or a combination thereof.

The electron transport layer may include inorganic nanoparticles, a quinolone compound, a triazine-containing compound, a quinoline-containing compound, a triazole-containing compound, a naphthalene-containing compound, or a combination thereof.

The electron transport layer may include a layer of a plurality of inorganic nanoparticles.

In an embodiment, a stack for an electroluminescent device including a light emitting layer includes a first light emitting layer disposed on a hole transport layer, and a second light emitting layer adjacent to the first light emitting layer and disposed on an electron transport layer, wherein the first light emitting layer comprises a first quantum dot, and the second light emitting layer comprises a second quantum dot and an n-type organic semiconductor.

The first light emitting layer of the stack may further include a p-type organic semiconductor, a highest occupied molecular orbital energy level of the n-type organic semiconductor is less than or equal to about −7.0 eV, and a lowest unoccupied molecular orbital energy level of the p-type organic semiconductor is greater than or equal to about −3.0 eV.

The first light emitting layer and the second light emitting layer may emit light with the same or different wavelength, the wavelengths being a range from 380 nm to 488 nm.

In the stack, a surface of the first quantum dot may include a ligand derived from a compound comprising a metal halide, and a ligand derived from a compound comprising a carboxylic acid, a compound comprising a thiol, or a combination thereof, and a number of the ligand derived from the compound comprising the metal halide to a total amount of the ligands attached to the surface of the first quantum dot is about 10 mole percent to about 40 mole percent; and a surface of the second quantum dot comprises a ligand derived from a compound comprising a carboxylic acid, a compound comprising a thiol, or a combination thereof, and a number of the ligand derived from the compound comprising the carboxylic acid, the compound comprising the thiol, or a combination thereof, to a total amount of the ligands attached to the surface of the second quantum dot is greater than or equal to about 80 mole percent.

In addition, a display device according to an embodiment includes the aforementioned electroluminescent device.

The electroluminescent device having improved luminous efficiency and life-span, and a display device including the electroluminescent device are provided.

BRIEF DESCRIPTION OF THE DRAWINGS

The application file contains at least one drawing executed in color. Copies of the patent or patent application publication with color drawing(s) will be provided by the Office upon request and payment of the necessary fee.

DETAILED DESCRIPTION

Figure 1:
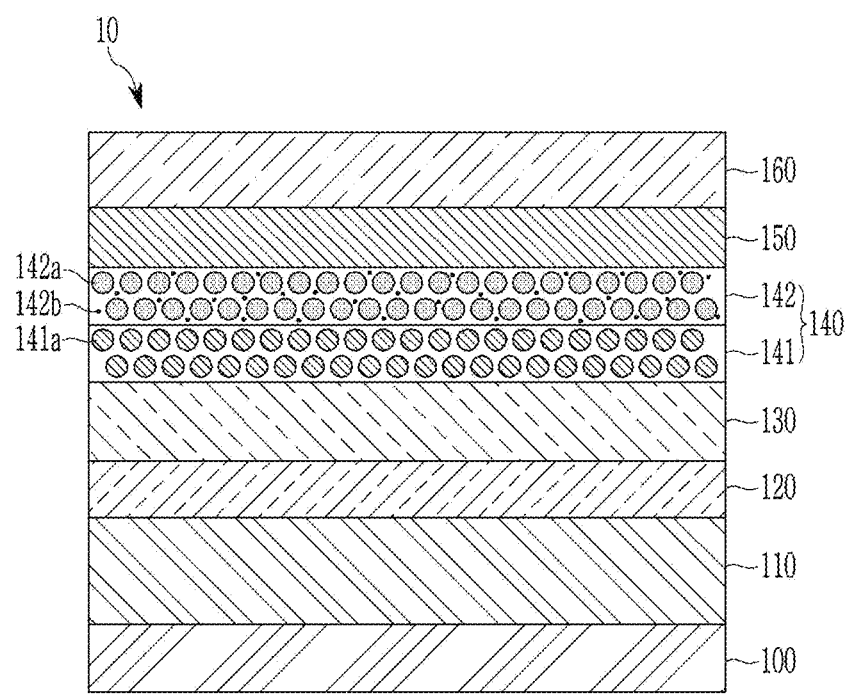
FIG. 1 is a cross-sectional schematic view of an electroluminescent device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise.

"At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. In the drawings, the thickness of layers, films, panels, regions, etc., are exaggerated for clarity. Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% or ±3% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Unless otherwise described in an embodiment, "thickness" refers to "an average thickness." The "average thickness" refers to an arithmetic average of values obtained by measuring the thickness of a measurement object (e.g., layer, etc.) several times to tens of several times from a scanning electron microscopic (SEM) image at random.

As used herein, for particle diameters of particles, though they may be defined by a measurement to show an average size of a group, the generally used method includes a mode diameter according to the maximum value of the distribution, a median diameter corresponding to the center value of integral distribution curve, a variety of average diameters (numeral average, length average, area average, mass average, volume average, etc.), and the like. Unless particularly mentioning otherwise, average particle diameters means to numeral average diameters in the present disclosure, and it is obtained by measuring D50 (particle diameters at a position of distribution rate of 50%).

As used herein, "Group" refers to a group of the Periodic Table.

As used herein, "Group II" refers to Group IIA and Group IIB, and examples of Group II metal may be Cd, Zn, Hg, and Mg, but are not limited thereto.

As used herein, examples of "Group II metal that does not include Cd" refers to a Group II metal except Cd, for example Zn, Hg, Mg, etc.

As used herein, "Group III" refers to Group IIIA and Group IIIB, and examples of Group III metal may be Al, In, Ga, and TI, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group I" refers to Group IA and Group IB, and examples may include Li, Na, K, Rb, and Cs, but are not limited thereto.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

An electroluminescent device including quantum dots (hereinafter, referred to as a quantum dot electroluminescent device) are attracting attention as a next generation display device due to high color reproducibility of quantum dots and ease of solution processing. However, in a quantum dot electroluminescent device, the flow of holes in a light emitting layer that includes quantum dots is generally not as uniform or consistent as compared to electron flow when an electric field is applied to the light emitting layer. Accordingly, the quantum dot electroluminescent device may require additional development in the following area(s) to resolve certain technical issues.

First, charges (electrons and holes) injected toward the light emitting layer tend to combine primarily at the interface of the hole transport layer and the light emitting layer, inside of the hole transport layer, and/or in the light emitting layer but near the interface of the hole transport layer and the light emitting layer. Accordingly, excitons inside the quantum dot electroluminescent device may tend to become trapped and quenched because of the several energy levels generated at or near the interface of the hole transport layer and the light emitting layer and/or in an internal conduction band of the hole transport layer and/or the light emitting layer near the interface.

Second, the injected electrons and holes may tend to combine and form excitons not in the light emitting layer, but in a non-light emitting layer (e.g., the hole transport layer). Consequently, the excitons formed in the non-light emitting layer make no contribution to light emission of the device, and instead, the excitons are quenched, and thus, the overall efficiency of the quantum dot electroluminescent device will decrease.

Third, an excess of injected electrons that do not combine with holes are continuously present at the interface of the hole transport layer and the light emitting layer, and thus may cause deterioration or breakdown of materials included in the light emitting layer and/or in the hole transport layer. In addition, the excess electrons may cause surface defects at the interface of the hole transport layer and the light emitting layer. These surface defects may facilitate the quenching of excitons, and may accelerate deterioration or breakdown of the device.

Accordingly, the present inventors developed a method of securing a stable hole-electron balance inside the quantum dot electroluminescent device. The excitons are more readily confined to the light emitting layer resulting in an improvement in luminous efficiency and life-span characteristics of the device. As a result of their research, the inventors discovered that when a quantum dot electroluminescent device includes a first and a second light emitting layer, and the light emitting layer proximate to the electron transport layer includes an n-type organic semiconductor, a more consistent hole-electron balance in the device is possible, and the location of recombination of electrons and holes may be adjusted or better controlled to an area within the light emitting layer, and thus, less exciton formation at or near the hole transport-emitting layer interface. The result of such a device structure is improved luminous efficiency and improved life-span characteristics.

FIG. 1 is a schematic cross-sectional representation of an electroluminescent device according to an embodiment.

An electroluminescent device 10 according to an embodiment includes a first electrode 110, a hole transport layer 130 disposed on the first electrode 110, a hole injection layer 120 disposed between the first electrode 110 and the hole transport layer 130. As used herein, the term "disposed on" is inclusive of two layers in direct contact with no intervening layers, and two adjacent layers with one or more layers optionally present between the two adjacent layers. A person of ordinary skill would further recognize and understand that the presence of a hole injection layer 120 is optional, and thus, may be omitted from the device. The device 10 also includes a light emitting layer 140 disposed on the hole transport layer 130, an electron transport layer 150 disposed on the light emitting layer 140, and a second electrode 160 disposed on the electron transport layer 150. The device may also include an electron injection layer (not shown) disposed between a second electrode 160 and electron transport layer 150.

In an embodiment, the light emitting layer 140 may include at least two or more layers. As shown, the light emitting layer 140 includes a first light emitting layer 141 disposed on the hole transport layer 130, the first emitting layer including first quantum dots 141a, and a second light emitting layer 142 disposed on the first light emitting layer 141, the second light emitting layer including second quantum dots 142a and n-type organic semiconductors 142b.

The electroluminescent device 10 may have a stacked structure in which the hole injection layer 120, the hole transport layer 130, the light emitting layer 140 including the first light emitting layer 141 and the second light emitting layer, and an electron transport layer 150, are positioned sequentially in a stack, between a first electrode 110 and a second electrode 160.

In an embodiment, the first electrode 110 may be directly connected to a driving power source so that a current flows through the light emitting layer 140. The first electrode 110 may include a material having light transmittance in at least visible light wavelength region but is not limited thereto. The first electrode 110 may include a material having light transmittance in an infrared or ultraviolet (UV) wavelength region. For example, the first electrode 110 may be an optically transparent material.

In an embodiment, the first electrode 110 may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof. However, the first electrode 110 according to an embodiment is not necessarily limited thereto but may include a material further having light transmittance with respect to light in an infrared or ultraviolet (UV) wavelength region. The first electrode 110 according to another embodiment may be a semi-transmittable material selectively transmitting light in a particular wavelength region as well as have the capability to reflect light in a visible light wavelength region back toward the first electrode 110 and out of the device.

In an embodiment, the first electrode 110 may be disposed on a substrate 100 as shown in FIG. 1. The substrate 100 may be a transparent insulating substrate, e.g., a glass or metal oxide, or may be made of a ductile or flexible material such as a plastic. The substrate 100 may include glass or a polymer material in a film having a glass transition temperature (Tg) of greater than about 150° C. For example, the substrate may be a COC (cycloolefin copolymer) or COP (cycloolefin polymer) based material.

In an embodiment, the substrate 100 may support the hole injection layer 120, the hole transport layer 130, the light emitting layer 140, and the electron transport layer 150 disposed between the first electrode 110 and the second electrode 160. Alternatively, a substrate may be disposed on the second electrode 160, or may be omitted.

The second electrode 160 includes an optically transparent material and may function as a light-transmitting electrode to transmit light generated in the light emitting layer 140. In an embodiment, the second electrode 160 may include at least one selected from silver (Ag), aluminum (Al), copper (Cu), gold (Au), and an alloy thereof, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof. However, the second electrode 160 according to an embodiment is not necessarily limited thereto.

The second electrode 160 may include a semi-transmittable material that selectively transmits light in a particular wavelength region and may also function to reflect light in a visible light wavelength region toward the first electrode 110. When the second electrode 160 functions as a reflecting electrode, the first electrode 110 may be a light-transmitting electrode formed of a material transmitting light in at least visible light wavelength region or a semi-transmittable electrode selectively transmitting light in a particular wavelength region.

Each of the first electrode 110 and the second electrode 160 may be formed by depositing a material for forming an electrode on the substrate 100 or an organic layer by a method known in the art such as sputtering. The electroluminescent device 10 according to an embodiment may have a conventional structure in which the substrate 100 and each constituent element are disposed in the aforementioned stacking order as shown in FIG. 1.

However, the embodiment is not necessarily limited thereto, and may have various structures as long as it satisfies the stacking order between the constituent elements of the aforementioned electroluminescent device 10. For example, when the substrate 100 is disposed on the second electrode 160 rather than adjacent to the first electrode 110, the electroluminescent device 10 may have an inverted structure.

The hole injection layer 120 may be disposed directly on the first electrode 110. The hole injection layer 120 may serve to supply holes to the light emitting layer 140 together with the hole transport layer 130. However, the hole injection layer 120 may be omitted in consideration of the thickness, material, and the like of the hole transport layer 130.

The hole injection layer 120 may be formed of a p-type semiconductor or a material doped with a p-type semiconductor. The hole injection layer 120 may include, for example, poly(3,4-ethylenedioxythiophene) (PEDOT) or a derivative thereof, poly(styrenesulfonate) (PSS) or a derivative thereof, poly-N-vinylcarbazole (PVK) or a derivative thereof, polyphenylene vinylene or a derivative thereof, poly p-phenylene vinylene (PPV) or a derivative thereof, polymethacrylate or a derivative thereof, poly(9,9-octylfluorene) or a derivative thereof, poly(spiro-bifluorene) or a derivative thereof, tris(4-carbazolyl-9-ylphenyl)amine (TCTA), N,N'-diphenyl-N,N'-bis(3-methylphenyl)-(1,1'-biphenyl)-4,4'-diamine (TPD), N,N'-di(naphthalen-1-yl)-N—N'-diphenyl-benzidine (NPB), tris(3-methylphenylphenylamino)-triphenylamine (m-MTDATA), poly-TPD, a metal oxide such as NiO or $MoO_3$, or a combination thereof, but is not necessarily limited thereto.

The hole transport layer 130 may be disposed on the first electrode 110, for example on the first electrode 110 and the hole injection layer 120. The hole transport layer 130 serves to supply and transport holes to the light emitting layer 140. The hole transport layer 130 is formed adjacent to the light emitting layer 140, specifically adjacent and proximate to the first light emitting layer 141, and may be in direct contact with the light emitting layer 140.

In an embodiment, the hole transport layer 130 may include a material having hole transport properties. Examples of the material having hole transport properties include a p-type semiconductor or a material doped with a p-type semiconductor. The material having hole transport properties are not limited to specific materials and may include a polymer, an oligomer, a metal oxide, or a combination thereof.

Examples of the material having hole transport properties may include a poly(3,4-ethylenedioxythiophene) derivative, a poly(styrenesulfonate) derivative, a poly-N-vinylcarbazole derivative, a polyphenylenevinylene derivative, a polyparaphenylenevinylene derivative, a polymethacrylate derivative, a polyarylamine derivative, a polyaniline derivative, a polypyrrole derivative, a poly(9,9-dioctylfluorene) derivative, a poly(spiro-bifluorene) derivative, tris(4-carbazolyl-9-ylphenyl)amine (TCTA), N,N'-diphenyl-N,N'-bis(3-methylphenyl)-(1,1'-biphenyl)-4,4'-diamine (TPD), N,N'-di(naphthalen-1-yl)-N—N'-diphenyl-benzidine (NPB), tris(3-methylphenylphenylamino)-triphenylamine (m-MTDATA), poly-TPD, NiO, $MoO_3$, or a combination thereof, but are not necessarily limited thereto.

In an embodiment, a thickness of the hole transport layer 130 may be adjusted in consideration of a hole-electron balance with the hole injection layer 120, the hole transport layer 130, and/or the light emitting layer 140 in the device. The thickness of the hole transport layer 130 may be for example greater than or equal to about 10 nm, greater than or equal to about 15 nm, or greater than or equal to about 20 nm, and for example, less than or equal to about 80 nm, less than or equal to about 70 nm, less than or equal to about 60 nm, or less than or equal to about 50 nm, or for example about 10 nm to about 80 nm, about 10 nm to about 70 nm, about 10 nm to about 60 nm, about 10 mm to about 50 nm, about 10 nm to about 40 nm, or about 20 nm to about 40 nm.

For example, the hole transport layer 130 may be formed through a wet coating process such as spin-coating and the like. For example, the hole transport layer 130 and the light emitting layer 140, and in particular, both the hole transport layer 130 and the first light emitting layer 141 may be formed by using the wet coating process.

In embodiment, the hole transport layer 130 and the first light emitting layer 141 may use materials having relatively different solubility. For example, the hole transport layer 130 may be formed by using a material having excellent solubility with an aromatic non-polar solvent, while the first light emitting layer 141 may be formed by using a material having excellent solubility with an aliphatic non-polar solvent. Accordingly, even though a solution process may be used to form the hole transport layer 130 and the first light emitting layer 141, the two layers in contact with each other, the first light emitting layer 141 may be formed without surface damage of the hole transport layer 130 due to a difference in solubility of the hole transport layer 130 and the first light emitting layer 141.

For example, when the hole transport layer 130 is formed of a poly[(9,9-dioctylfluoren-2,7-diyl)-co-(4,4'-(N-4-butylphenyl)diphenylamine)] (TFB) polymer, a precursor solution including a TFB precursor polymer and the aromatic non-polar solvent (e.g., toluene, xylene, etc.) is spin-coated on the first electrode 110 or the hole injection layer 120 and then, heat-treated, for example, at about 150° C. to about 1800° C. for 30 minutes under an inert gas atmosphere of N2 or under vacuum to form the TFB hole transport layer 130. The first light emitting layer 141 may then be easily formed on the hole transport layer 130 by using an aliphatic non-polar solvent (e.g., octane, nonane, cyclohexane, etc.) in a solution method, by spin coating described above.

In this manner, when the hole transport layer 130 and the first light emitting layer 141 are formed with different solubility characteristics, the hole transport layer 130 and the first light emitting layer 141 may be more easily formed by using the solution process. In other words, surface damage to the hole transport layer 130 may be minimized by an appropriate selection of organic solvent and the like during formation of the first light emitting layer 141. See, FIG. 1.

The light emitting layer 140 may be disposed on the hole transport layer 130 and may include quantum dots. In an embodiment, the light emitting layer 140 may include the first light emitting layer 141 and the second light emitting layer 142 as described above. In an embodiment, each of the first light emitting layer 141 and the second light emitting layer 142 may include quantum dots. Hereinafter, the quantum dots included in the first light emitting layer 141 are referred to as first quantum dots 141a, and the quantum dots included in the second light emitting layer 142 are referred to as second quantum dots 142a.

The light emitting layer 140 is a site where electrons and holes, which are formed by an applied current across the first electrode 110 and the second electrode 160, are combined in the light emitting layer 140 to generate excitons, and the generated excitons upon relaxation from an exited state to a ground state emit light in a wavelength corresponding to the particle size of the quantum dots. That is, the quantum dots impart electroluminescence to the light emitting layer 140.

Particularly, the quantum dots may have a discontinuous energy bandgap by the quantum confinement effect, and thus, the incident light may be converted into a light having a particular wavelength that then radiates out from the device. Therefore, the light emitting layer 140 including the quantum dots may generate light having improved color reproducibility and color purity.

In an embodiment, the light emitting layer 140 may emit light in a predetermined wavelength region by the quantum dots. In an embodiment, each of the first light emitting layer 141 and the second light emitting layer 142 may emit light of a predetermined wavelength or wavelength region. The light emitted by first light emitting layer 141, and the second light emitting layer 142, may be the same or different wavelength or wavelength region. In one embodiment, each of the first quantum dots 141a and the second quantum dots 142a may emit light of the same wavelength or wavelength region. In an embodiment, the emitted light belongs to a visible light region, for example, one of a first wavelength region of about 380 nm to about 488 nm, a second wavelength region of about 490 nm to about 510 nm, a third wavelength region of about 510 nm to about 580 nm, a fourth wavelength region of about 582 nm to about 600 nm, and a fifth wavelength region of about 620 nm to about 680 nm.

In an embodiment, each of the first quantum dots 141a and the second quantum dots 142a may emit blue light in the first wavelength region of about 380 nm to about 488 nm. In this case, the light emitting layer 140 may be a blue light emitting layer.

Alternatively, each of the first quantum dots 141a and the second quantum dots 142a may emit green light in the third wavelength region of about 510 nm to about 580 nm. In this case, the light emitting layer 140 may be a green light emitting layer.

Alternatively, each of the first quantum dots 141a and the second quantum dots 142a may emit amber light in the fourth wavelength region of about 582 nm to about 600 nm. In this case, the light emitting layer 140 may be an amber light emitting layer.

Alternatively, each of the first quantum dots 141a and the second quantum dots 142a may emit red light in the fifth wavelength region of about 620 nm to about 680 nm. In this case, the light emitting layer 140 may be a red light emitting layer.

In an embodiment, the materials of the first quantum dots 141a and the second quantum dots 142a are not particularly limited, and any known or commercially available quantum dots may be used.

In an embodiment, at least one of the first quantum dots 141a and the second quantum dots 142a may include a core including a first semiconductor nanocrystal and a shell including a second semiconductor nanocrystal having a composition different from the first semiconductor nanocrystal and disposed on the core. That is, one of the first quantum dots 141a and the second quantum dots 142a may have the core-shell structure, and both the first quantum dots 141a and the second quantum dots 142a may have the core-shell structure.

In an embodiment, the core and the shell may have an interface, and an element of at least one of the core or the shell in the interface may have a concentration gradient wherein the concentration of the element(s) of the shell decreases toward the core.

In an embodiment, the quantum dots may have a structure (core-single shell structure) that includes a core and one layered shell surrounding the core. In this case, the single shell structure may have a single composition or concentration gradient.

However, an embodiment is not necessarily limited thereto, and the at least one of the first quantum dots 141a and the second quantum dots 142a may have a structure including a core and a multi-layered shell surrounding the core. Herein, the multi-layered shell structure has a structure of two or more shells and each layer may have a single composition or an alloy or may have a concentration gradient.

When the at least one of the first quantum dots 141a and the second quantum dots 142a have a core-shell structure, a material composition of the shell has a larger energy bandgap than that of the core, which may exhibit an effective quantum confinement effect. However, the embodiment is not limited thereto. Meanwhile, in the multi-layered shell, a shell that is outside of the core has may have a higher energy bandgap than a shell that is near to the core and the quantum dot(s) having a core-multi-layered shell structure of the first quantum dots 141a and the second quantum dots 142a may have an ultraviolet (UV) to infrared wavelength range.

In an embodiment, the first semiconductor nanocrystal included in the core and the second semiconductor nanocrystal included in the shell may independently include a Group II-VI compound that does not include Cd, a Group III-V compound, a Group IV-VI compound, a Group IV element or compound, a Group I-III-VI compound, a Group I-II-IV-VI compound that does not include Cd, or a combination thereof. That is, the first and second quantum dots 141a and 142a according to an embodiment may be a non-cadmium-containing quantum dot. When the first and second quantum dots 141a and 142a are composed of non-cadmium-containing quantum dots, there are no consumer toxicity concerns, e.g., for improper disposal of a device compared with a conventional cadmium-containing quantum dots, and thus, is not hazardous and is more environmentally-friendly.

The Group II-VI compound may be selected from a binary element compound selected from ZnS, ZnSe, ZnTe, ZnO, HgS, HgSe, HgTe, MgSe, MgS, and a mixture thereof; a ternary element compound selected from ZnSeS, ZnSeTe, ZnSTe, HgSeS, HgSeTe, HgSTe, HgZnS, HgZnSe, HgZnTe, MgZnSe, MgZnS, and a mixture thereof; and a quaternary element compound selected from HgZnTeS, HgZnSeS, HgZnSeTe, HgZnSTe, and a mixture thereof. The Group II-VI compound may further include a Group III metal.

The Group III-V compound may be selected from a binary element compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, InZnP, and a mixture thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal (InZnP).

The Group IV-VI compound may be selected from a binary element compound selected from SnS, SnSe, SnTe, PbS, PbSe, PbTe, and a mixture thereof; a ternary compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof. Examples of the Group compound may be $CuInSe_2$, $CuInS_2$, CuInGaSe, and CuInGaS, are not limited thereto. Examples of the Group I-II-IV-VI compound may be CuZnSnSe and CuZnSnS but are not limited thereto. Examples of the Group IV compound may be a single substance selected from Si, Ge, and a mixture thereof; and a binary element compound selected from SiC, SiGe, and a mixture thereof.

The binary element compound, the ternary element compound, or the quaternary element compound respectively exists in a uniform concentration in the particle or in partially different concentrations in the same particle.

The first and second quantum dots 141a and 142a may have quantum efficiency of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 90%, or even 100%.

In a display, the first and second quantum dots 141a and 142a may have a relatively narrow emission spectrum so as to improve color purity or color reproducibility. The first and second quantum dots 141a and 142a may independently have a full width at half maximum (FWHM) of a photoluminescence wavelength spectrum of less than or equal to about 45 nm, less than or equal to about 40 nm, or less than or equal to or about 30 nm. Within the ranges, color purity or color reproducibility of a device may be improved.

The first and second quantum dots 141a and 142a may independently have a particle diameter (the longest diameter for a non-spherically shaped particle) of about 1 nm to about 100 nm. For example, the first and second quantum dots 141a and 142a may have independently a particle diameter (the longest diameter for a non-spherically shaped particle) of about 1 nm to about 20 nm, for example about 1 nm to about 15 nm, about 1 nm to about 14 nm, about 1 nm to about 3 nm, about 1 nm to about 12 nm, about 1 nm to about 11 nm, or about 1 nm to about 10 nm.

In addition, the shapes of the first and second quantum dots 141a and 142a may be general shapes in this art and thus may not be particularly limited. For example, the quantum dots may have a spherical, oval, tetrahedral, pyramidal, cuboctahedral, cylindrical, polyhedral, multi-armed, or cubic nanoparticle, nanotube, nanowire, nanofiber, nanosheet, or a combination thereof. The quantum dots may have any cross-sectional shape.

The first and second quantum dots 141a and 142a may be commercially available or may be synthesized using methods known in the art. For example, several nanometer-sized quantum dots may be synthesized according to a wet chemical process. In the wet chemical process, precursor materials react in an organic solvent to grow crystal particles. Herein, the organic solvent or the surfactants for forming ligands are naturally coordinated to the surfaces of the quantum dots to control the growth of crystals. Specific types of organic solvent or surfactants for forming ligands are known.

The organic solvent or surfactants for forming ligands may be selected appropriately. Examples of the organic solvent may include C6 to C22 primary amine such as hexadecylamine; C6 to C22 secondary amine such as dioctylamine; C6 to C40 tertiary amine such as trioctylamine; nitrogen-containing heterocyclic compounds such as pyridine; C6 to C40 olefin such as octadecene; C6 to C40 aliphatic hydrocarbon such as hexane, octane, hexadecane, octadecane, or squalane; aromatic hydrocarbon substituted with a C6 to C30 alkyl group such as phenyldodecane, phenyltetradecane, or phenyl hexadecane; primary, secondary, or tertiary phosphine (e.g., trioctylphosphine) substituted with at least one (e.g., 1, 2, or 3) C6 to C22 alkyl group; phosphine oxide (e.g. trioctylphosphine oxide) substituted with at least one (e.g., 1, 2, or 3) C6 to C22 alkyl group; C12 to C22 aromatic ether such as phenyl ether, benzyl ether; or a combination thereof.

Examples of the surfactants for forming ligands may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', RPO$(OH)_2$, RHPOOH, $R_2POOH$ (wherein, R and R' are independently hydrogen, a C1 to C40 substituted or unsubstituted aliphatic hydrocarbon, or C6 to C40 substituted or unsubstituted aromatic hydrocarbon, or a combination thereof, and in each ligand, at least one R is not hydrogen), or a combination thereof, but are not limited thereto.

The organic solvent coordinated on the surface of the quantum dot may affect stability of a device, and thus excess materials (organic solvents, surfactants for forming ligands, or combinations thereof) that are not coordinated on the surface of the nanocrystals may be removed by pouring it in excessive non-solvent, and centrifuging the resulting mixture. Specific examples of the non-solvent include, but are not limited to, acetone, ethanol, and methanol. After removing excess material, the amount of materials coordinated to the surfaces of the quantum dots may be less than or equal to about 50 wt %, for example, less than or equal to about 30 wt %, less than or equal to about 20 wt %, or less than or equal to about 10 wt % of the weight of the quantum dots. The materials coordinated to the surfaces of the quantum dots may include ligands, organic solvents, or a combination thereof. The materials coordinated to the surfaces of the quantum dots, specifically the ligands, may impart dispersion to the quantum dots.

In an embodiment, at least one of the surfaces of the first and second quantum dots 141a and 142a may have ligands attached to a surface of the quantum dots. Examples of the ligand in an embodiment may include a compound including a metal halide, a compound including a carboxylic acid, a compounds including a thiol, or a combination thereof.

In an embodiment, the ligand may be a ligand having a hydrophobic moiety (hereinafter referred to as a hydrophobic ligand). In this case, the hydrophobic ligand may include a moiety that chemically bound to the surfaces of the attached quantum dots and a hydrophobic functional group imparting hydrophobicity. In an embodiment, examples of the hydrophobic ligand may be derived from a compound including a carboxylic acid, a compound including a thiol, or a combination thereof.

The hydrophobic moiety may include for example a C4 to C20 alkyl group, a C4 to C20 alkenyl group, a C4 to C20 alkynyl group, or a combination specific, and a moiety that is bound to the surface of the quantum dots may be for example a carboxylate (—COO$^-$) moiety, a thiolate (—SH$^-$) moiety, etc.

In an embodiment, examples of the compound including the carboxylic acid may be a compound including a fatty acid, such as, oleate, stearate, palmitate, and the like. In an embodiment, examples of the compound including a thiol may be C6 to C20 aliphatic thiolate.

For example, if the first quantum dots 141a have hydrophobic ligands as described above, the first light emitting layer 141 including the same may also be non-polar when viewed as a whole. In addition, the first quantum dots to which the hydrophobic ligands are attached have solvent selectivity for non-polar solvents, specifically aliphatic non-polar solvents. Accordingly, even if the first light emitting layer 141 is formed by using a solution process directly on the hole transport layer 130 having solvent selectivity for an aromatic non-polar solvent, the surface damage of the hole transport layer 130 by organic solvents may be minimized during the formation of the first light emitting layer 141. However, an embodiment is not necessarily limited thereto, and the second quantum dots 142a may have the aforementioned hydrophobic ligand, and the first and second quantum dots 141a and 141b may not all have the aforementioned hydrophobic ligand.

For example, at least one of the first or the second quantum dots 141a and 141b may have a ligand having a lower solubility for an organic solvent than the aforementioned hydrophobic ligand attached to the quantum dots. In this case, examples of the ligand may be derived from the compound including the metal halide.

The metal halide may include zinc, indium, gallium, magnesium, lithium, or a combination thereof and/or may be in a form of chloride, bromide, iodide, or fluoride. The metal included in the metal halide may be the same as the metal included in the outermost layer of the quantum dots, or they may be different from each other.

Specific examples of the metal halide may include zinc fluoride, zinc chloride, zinc bromide, zinc iodide, indium fluoride, indium chloride, indium bromide, indium iodide, gallium fluoride, gallium chloride, gallium bromide, gallium iodide, magnesium fluoride, magnesium chloride, magnesium bromide, magnesium iodide, lithium fluoride, a lithium chloride, lithium bromide, lithium iodide, or a combination thereof.

The ligand derived from a compound including the metal halide may include a moiety that is chemically bound to the surface of the attached quantum dot. Examples of the moiety that is bound to a surface of the quantum dot may be a halogen ion moiety (e.g., $F^-$, $Cl^-$, $Br^-$, or $I^-$). The halogen ion moiety may be strongly bound to the surface of the quantum dot and may passivate the quantum dot instead of other ligands (e.g., replacing hydrophobic ligands such as oleic acid) present on the surface of the quantum dot.

The ligand derived from a compound including the metal halide may be obtained by reacting a metal halide solution on the light emitting layer including quantum dots to which the aforementioned hydrophobic ligands are attached. At least a portion of the hydrophobic ligands attached to the quantum dots may be replaced (or substituted) with the aforementioned halogen ion moiety. An amount, i.e., the weight of the ligands derived from a compound including the metal halide relative to the amount, i.e., the weight of hydrophobic ligands attached to the surfaces of the quantum dots may be varied by controlling a concentration of the metal halide solution and a reaction time.

Although not intended to be bound by specific theories, the aforementioned hydrophobic ligands may reduce luminous efficiency of the quantum dots because the hydrophobic moiety generally acts as a substantial barrier to electron and hole injections. However, in an embodiment, the quantum dots to which the ligand derived from a compound including the metal halide is attached may provide improved charge injection characteristics as well as improved passivation compared with the quantum dot to which the aforementioned hydrophobic ligand is attached.

In an embodiment, a thickness of the light emitting layer 140, specifically a total thickness of the first and second light emitting layers 141 and 142, may be varied according to types and sizes of the first and second quantum dots 141a and 142a included in the first and second light emitting layers 141 and 142, and types of ligands attached thereto. The thickness of the light emitting layer 140 may be, for example, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, greater than or equal to about 25 nm, greater than or equal to about 30 nm, or greater than or equal to about 35 nm. The light emitting layer 140 may include two or more monolayers of quantum dots, for example, three or more layers of quantum dots, or four or more layers of quantum dots. A thickness of the light emitting layer 140 may be less than or equal to about 100 nm, for example, less than or equal to about 90 nm, less than or equal to about 80 nm, less than or equal to about 70 nm, less than or equal to about 60 nm, less than or equal to about 50 nm, or less than or equal to about 40 nm. The thickness of the light emitting layer 140 may be about 10 nm to about 60 nm, for example about 15 nm to about 60 nm, about 20 nm to about 60 nm, about 25 nm to about 60 nm, or about 25 nm to about 50 nm.

The electroluminescent device 10 according to the embodiment may include a quantum dot in a predetermined amount in order to improve luminous efficiency of the light emitting layer 140.

For example, a sum total amount of the first and second quantum dots 141a and 142a may be for example greater than or equal to about 5 wt %, greater than or equal to about 10 wt %, greater than or equal to about 15 wt %, or greater than or equal to about 20 wt %, and for example less than or equal to about 98 wt %, less than or equal to about 95 wt %, less than or equal to about 90 wt %, less than or equal to about 85 wt %, less than or equal to about 80 wt %, less than or equal to about 75 wt %, less than or equal to about 70 wt %, less than or equal to about 65 wt %, less than or equal to about 60 wt %, less than or equal to about 55 wt %, or less than or equal to about 50 wt %, or for example about 5 wt % to about 98 wt %, about 20 wt % to about 98 wt %, about 20 wt % to about 90 wt %, about 20 wt % to about 85 wt %, about 50 wt % to about 85 wt %, about 50 wt % to about 80 wt %, based on 100 wt % of the light emitting layer 140.

However, an embodiment is not necessarily limited thereto, and the total amount of the first and second quantum dots 141a and 142a in the light emitting layer 140 may be different from one another depending on other constituent elements included in the light emitting layer 140 (e.g., the binder, n-type organic semiconductor, p-type organic semiconductor, etc.), types and/or contents of used ligands, materials of the first and second quantum dots 141a and 142a, a wavelength range of emitted light, thicknesses of the electron transport layer 130, the light emitting layer 140, and/or the electron transport layer 150, and the like.

In an embodiment, the first light emitting layer 141 may include the first quantum dots 141a and p-type organic semiconductor 141b. The first light emitting layer 141 may provide holes received from an adjacent hole transport layer 130 to the second light emitting layer 142, and the holes are recombined with electrons to emit light at a predetermined wavelength region using the first quantum dots 141a.

The second light emitting layer 142 is formed on the first light emitting layer 141, in an exemplary embodiment, the second light emitting layer 142 is formed directly on the first light emitting layer 141, and may include the second quantum dots 142a and n-type organic semiconductors 142b. The second light emitting layer 142 may provide electrons from the adjacent electron transport layer 150 to the first light emitting layer 141, and the electrons are recombined with holes to emit light at a predetermined wavelength region using the second quantum dots 142a.

In an embodiment, the first light emitting layer 141 and the second light emitting layer 142 may be separate layers distinguished from each other. For example, the first light emitting layer 141 and the second light emitting layer 142 may be distinguished primarily by types of the first quantum dots 141a and the second quantum dots 142a, by types and/or ratios of the attached ligand, by the content of n-type organic semiconductors 142b, and/or by identifying electron-holes recombination position.

In an embodiment, the n-type organic semiconductors 142b included in the second light emitting layer 142 may have electron transport (electron transfer) characteristics and/or hole block characteristics. Accordingly, the second light emitting layer 142 may exhibit improved electron transport properties and may act as an energy barrier for the movement of holes from the first light emitting layer 141 to the second light emitting layer 142.

Specifically, the HOMO (highest occupied molecular orbital) energy level of the n-type organic semiconductors 142b may vary depending on materials constituting the electron transport layer 150, materials of the second quantum dots 142a, and the like. However, it may be less than or equal to about −7.0 eV, less than or equal to about −7.05 eV, less than or equal to about −7.1 eV, less than or equal to about −7.15 eV, less than or equal to about −7.2 eV, less than or equal to about −7.25 eV, or less than or equal to about −7.3 eV.

Meanwhile, the LUMO energy level of the n-type organic semiconductors 142b may be equal to or greater than the adjacent electron transport layer 150.

Accordingly, the second light emitting layer 142 may exhibit improved electron transport characteristics and/or hole blocking characteristics due to the n-type organic semiconductors 142b.

In an embodiment, the n-type organic semiconductors 142b are not particularly limited as long as they have electron transport (electron transfer) characteristics and/or hole block characteristics.

Examples of the n-type organic semiconductors 142b may include an n-type monomolecular organic semiconductor, an n-type polymer organic semiconductor, or a combination thereof.

Examples of the n-type monomolecular organic semiconductor may be 1,3,5-tri(diphenylphosphoryl-phen-3-yl) benzene (TP3PO), 1,3,5-triazine-2,4,6-triyl)tris(benzene-3,1-diyl)tris(diphenylphosphine oxide) (POT2T), diphenylbis (4-(pyridin-3-yl)phenyl)silane (DPPS), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 1,3,5-tris(1-phenyl-1Hbenzimidazole-2-yl)benzene (TPBi), 4,7-diphenyl-1,10-phenanthroline (Bphen), 1,3-bis[2-(2,2'-bipyridin-6-yl)-1,3,4-oxadiazol-5-yl]benzene (Bpy-OXD), 2-(4-biphenyl)-5-(4-tert-butylphenyl)-1,3,4-oxadiazole (PBD), bathocuproine (BCP), 4,4'-bis(carbazol-9-yl)-2,2'-dimethylbiphenyl (CDBP), tris[3-(3-pyridyl)-mesityl]borane (3TPYMB), or a combination thereof.

Examples of the n-type polymer organic semiconductors may include conjugation polymer compounds including elements such as phosphorus (P), oxygen (O), nitrogen (N), and the like, and may specifically include a quinolone-containing compound, a triazine-containing polymer compound, a quinoline-containing polymer compound, a triazole-containing compound, or a naphthalene-containing polymer compound.

In an embodiment, the n-type organic semiconductors 142b may be, for example, included in an amount of less than or equal to about 0.5 wt %, less than or equal to about 0.4 wt %, or less than or equal to about 0.3 wt %, for example greater than 0 wt %, or greater than or equal to about 0.1 wt %, for example greater than 0 wt % and less than or equal to about 0.5 wt %, greater than 0 wt % and less than or equal to about 0.4 wt %, for example greater than 0 wt % and less than or equal to about 0.3 wt % based on a total weight of the second light emitting layer 142 and thus may allow the second light emitting layer 142 to exhibit the aforementioned electron transport characteristics and/or hole blocking characteristics.

In an embodiment, the second light emitting layer 142 may be formed using a solution process. For example, the second light emitting layer 142 may be formed by coating and curing a solution including the second quantum dots 142a and the n-type organic semiconductors 142b directly on the first light emitting layer 141.

In an embodiment, the second quantum dots 142a may be attached with different types of ligands from the first quantum dots 141a, or may be attached with the same types of ligands. When the same types of ligands as the first quantum dots 141a is attached, an amount, i.e., a weight of the hydrophobic ligand attached to the second quantum dots 142a and the amount, i.e., weight, of ligands derived from a compound including the metal halide may be different from the first quantum dots 141a.

For example, the surface of the second quantum dots 142a may include the aforementioned hydrophobic ligands (e.g., the ligand derived from the compound including a carboxylic acid, a compound including a thiol, or a combination thereof) in consideration of dispersion with solvents in the solution process. In this case, a weight of the hydrophobic ligands relative to the total weight of ligands attached to the surface of the second quantum dots 142a may be greater than or equal to about 80 percent (%), greater than or equal to about 85%, greater than or equal to about 90%, greater than or equal to about 91%, greater than or equal to about 92%, greater than or equal to about 93%, greater than or equal to about 94%, greater than or equal to about 95%, greater than or equal to about 96%, greater than or equal to about 97%, greater than or equal to about 98%, greater than or equal to about 99%, or even 100%.

In an embodiment, each of the first and second light emitting layers 141 and 142 may include one or more monolayers of quantum dots or 1.5 or more monolayers of quantum dots.

Each thickness of the first and second light emitting layers 141 and 142 may be varied according to materials of the first and second quantum dots 141a and 142a, types of ligands, and contents of other constituent elements in each light emitting layer. The thickness of the first and second light emitting layers 141 and 142 may be, for example, less than or equal to about 50 nm, less than or equal to about 40 nm, less than or equal to about 30 nm, or less than or equal to about 20 nm, and for example greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, or greater than or equal to about 15 nm, or for example about 5 nm to about 50 nm, about 5 nm to about 40 nm, about 5 nm to about 30 nm, or about 10 nm to about 30 nm.

In an embodiment, the electron transport layer 150 may be disposed between the light emitting layer 140 and the second electrode 160, and specifically directly on the second light emitting layer 142, and serves to transport electrons to the light emitting layer 140.

In an embodiment, a thickness of the electron transport layer 150 may be varied in consideration of an electron-hole balance with the hole injection layer 120, hole transport layer 130, and/or light emitting layer 140, in the device, and the thickness of the electron transport layer 150 may be, for example, greater than or equal to about 10 nm, greater than or equal to about 15 nm, or greater than or equal to about 20 nm and for example less than or equal to about 100 nm, less than or equal to about 90 nm, less than or equal to about 80 nm, less than or equal to about 70 nm, less than or equal to about 60 nm, less than or equal to about 50 nm, or less than or equal to about 40 nm, or for example about 10 nm to about 100 nm, about 10 nm to about 60 nm, about 10 nm to about 50 nm, about 10 mm to about 40 nm, or about 15 nm to about 40 nm.

When the thickness of the electron transport layer 150 is out of the above range, effects of voids and cracks in the electron transport layer 150 on the electron transport properties may increase and thus device characteristics may be greatly deteriorated and it may be difficult to balance the electron-holes with other constituent elements in the electroluminescent device 10.

In an embodiment, the electron transport layer 150 may be made of a material for non-light emitting electron transport which does not emit light by an electric field so as not to cause the quenching of electrons inside the layer.

The electron transport layer 150 may include inorganic nanoparticles or may be an organic layer formed by a deposition. For example, the electron transport layer 150 may include inorganic nanoparticles, a quinolone-containing compound, a triazine-containing compound, a quinoline-containing compound, a triazole-containing compound, a naphthalene-containing compound, or a combination thereof.

In an embodiment, the electron transport layer 150 may include inorganic nanoparticles. The inorganic nanoparticles impart electron transport properties to the electron transport layer 150 and do not exhibit light emitting properties. Examples of the inorganic nanoparticles may include a salt of metals including zinc (Zn), magnesium (Mg), tin (Sn) zirconium (Zr), titanium (Ti), aluminum (Al), or a combination thereof. The inorganic nanoparticles may be made of the same material as the aforementioned n-type organic semiconductor or may be made of different materials from the aforementioned n-type organic semiconductor.

In an embodiment, the electron transport layer 150 may include two or more inorganic nanoparticles. In an embodiment, the electron transport layer 150 may include a population layer composed of two or more inorganic nanoparticles.

In addition, an electron injection layer to facilitate injection of electrons and a hole blocking layer to prevent movement of holes may be further formed between the electron transport layer 150 and the second electrode 160. The thickness of the electron injection layer and the hole blocking layer may be appropriately selected. For example, a thickness of each layer may be in a range of greater than or equal to about 1 nm and less than or equal to about 500 nm but is not limited thereto. The electron injection layer may be an organic layer formed by deposition.

The electron injection layer and/or the hole blocking layer may include, for example, at least one of 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, Liq, an n-type metal oxide (e.g., ZnO, $HfO_2$, etc.), Bphen, and a combination thereof, but is not limited thereto.

Hereinafter, an emission mechanism of the electroluminescent device 10 according to an embodiment realized by the first and second light emitting layers 141 and 142 is described.

First, the holes are injected from the first electrode 110 (for example ITO) and reach the first light emitting layer 141 through the hole injection layer 120 (for example PEDOT:PSS) and the hole transport layer 130 (for example TFB). The electrons are injected from the second electrode 160 (for example Al) to reach the second light emitting layer 142 through the electron transport layer 150 (for example, ZnMgO).

The holes reaching the first light emitting layer 141 are blocked from moving to the second light emitting layer 142 by the low HOMO energy level of the n-type organic semiconductor and stay in the first light emitting layer 141. Accordingly, the electroluminescent device 10 according to an embodiment may secure a relatively stable hole-electron balance using the first and second light emitting layers 141 and 142.

Accordingly, the holes staying in the first light emitting layer 141 and the electrons staying in the second light emitting layer 142 may form a recombination at the interface between the first light emitting layer 141 and the second light emitting layer 142, or around the interface of the two emitting layers.

As described above, the electroluminescent device 10 according to an embodiment is configured as a dual layer of the first and second light emitting layers 141 and 142 and by using the n-type organic semiconductors 142b included in the second light emitting layer 142. Accordingly, the electron-hole balance in the device may be stably secured, and thus, a recombination position of the electrons-holes may be confined inside the light emitting layer 140. As a result, the electroluminescent device 10 may exhibit improved luminous efficiency and life-span characteristics.

Hereinafter, referring to FIGS. 2 and 3, an electroluminescent device 10' according to another embodiment is described. For the electroluminescent device 10' according to another embodiment, detailed descriptions of constituent elements identical to those of the aforementioned electroluminescent device 10 are omitted.

Figure 2:
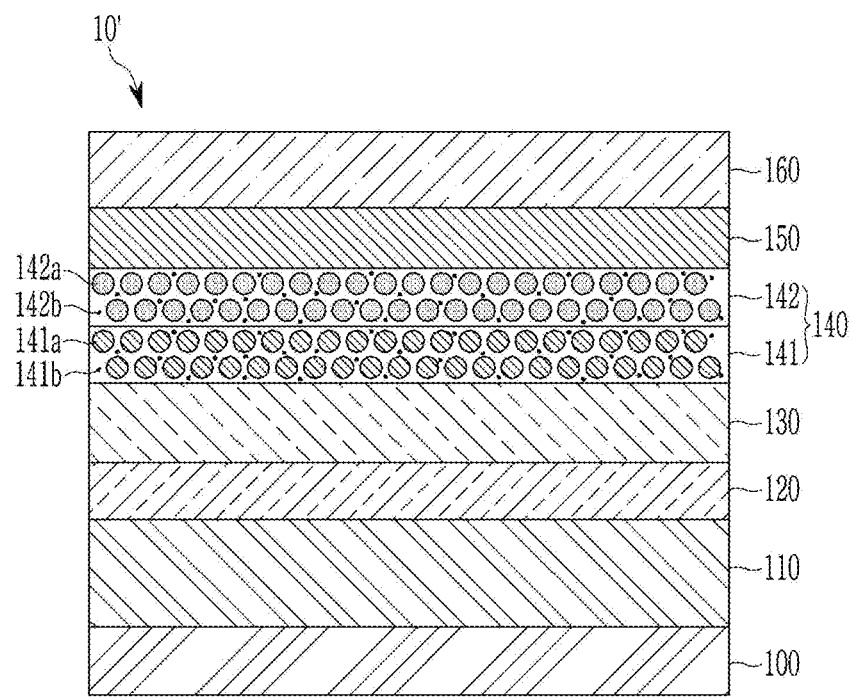
FIG. 2 is a cross-sectional schematic view of an electroluminescent device according to another embodiment.
Figure 3:
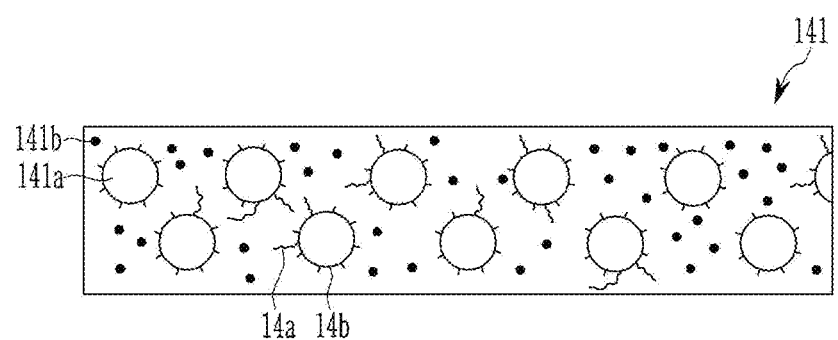
FIG. 3 shows an enlarged view of a first light emitting layer as shown in FIG. 2.

FIG. 2 is a cross-sectional schematic view of an electroluminescent device according to an embodiment, and FIG. 3 shows an enlarged view of the first light emitting layer of FIG. 2.

Referring to FIGS. 2 and 3, the electroluminescent device 10' according to another embodiment has the same constituent elements as the electroluminescent device 10 according to the aforementioned embodiment except that the first light emitting layer 141 further includes a p-type organic semiconductor 141b in addition to the first quantum dots 141a.

In the electroluminescent device 10' according to another embodiment, the first light emitting layer 141 and the second light emitting layer 142 may form a p-n junction in the light emitting layer 140.

In another embodiment, the p-type organic semiconductor 141b may have hole transport (hole transfer) characteristics and/or electron block characteristics.

A LUMO (lowest unoccupied molecular orbital) energy level of the p-type organic semiconductor 141b may be different depending on materials of the hole transport layer 130, materials of the first quantum dots 141a, and the like. However, the LUMO energy level of the p-type organic semiconductor 141b may be, for example, greater than or equal to about −3.0 eV,—greater than or equal to about 2.9 eV, greater than or equal to about −2.8 eV, greater than or equal to about −2.7 eV, greater than or equal to about −2.6 eV, greater than or equal to about −2.5 eV, or greater than or equal to about −2.4 eV. The LUMO energy level of the p-type organic semiconductor 141b may be equal to or greater than the adjacent hole transport layer 130.

In another embodiment, a HOMO (highest occupied molecular orbital) energy level of the p-type organic semiconductor 141b may be equal to, higher, or lower than the HOMO energy level of the hole transport layer 130. An absolute value of the difference in energy values of the p-type organic semiconductor 141b and the hole transport layer 130 may be less than or equal to about 0.5 eV, less than or equal to about 0.4 eV, less than or equal to about 0.3 eV, less than or equal to about 0.2 eV, less than or equal to about 0.1 eV, or very close to 0 eV.

Accordingly, the first light emitting layer 141 may exhibit improved hole transport characteristics and/or electron blocking characteristics due to the p-type organic semiconductor 141b.

In another embodiment, the p-type organic semiconductor 141b is not particularly limited as long as it satisfies the aforementioned LUMO energy level and has hole transport (hole transfer) characteristics and/or electron block characteristics.

In another embodiment, examples of the p-type organic semiconductor 141b may include a p-type monomolecular organic semiconductor, a p-type polymer organic semiconductor, or a combination thereof.

In another embodiment, a p-type monomolecular organic semiconductor may be used as the p-type organic semiconductor 141b. In this case, a leakage current of the first light emitting layer 141 may be effectively prevented, but the hole transport characteristics and/or electron blocking characteristics of the first light emitting layer 141 may be improved.

Examples of the p-type monomolecular organic semiconductor may include tris(4-carbazol-9-yl phenyl)amine (TCTA), N,N'-bis(3-methylphenyl)-N,N'-diphenylbenzidine (TPD), N,N'-bis(3-methylphenyl)-N,N'-bis(phenyl)-2,7-diamino-9,9-spirobifluorene (spiro-TPD), N,N'-bis(3-methylphenyl)-N,N'-bis(phenyl)-9,9-dioctylfluorene (DOFL-TPD), N,N'-bis(3-methylphenyl)-N,N'-bis(phenyl)-2,7-diamino-9,9-diphenyl-fluorene (DPFL-TPD), N,N'-bis(3-methylphenyl)-N,N'-bis(phenyl)-2,7-diamino-9,9-dimethylfluorene (DMFL-TPD), N1,N1'-(biphenyl-4,4'-diyl)bis(N1-phenyl-N4,N4-di-m-tolylbenzene-1,4-diamine) (DNTPD), N,N,N',N'-tetra-(3-methylphenyl)-3,3'-dimethylbenzidine (HMTPD), N,N'-di(naphthalen-1-yl)-N—N'-diphenyl-benzidine (NPB), N2,N7-di(naphthalen-1-yl)-9,9-dioctyl-N2,N7-diphenyl-9H-fluorene-2,7-diamine (DOFL-NPB), N,N'-bis(naphthalen-1-yl)-N,N'-bis(phenyl)-2,7-diamino-9,9-spirobifluorene (spiro-NPB), 2,2',7,7'-tetrakis[N-naphthalenyl(phenyl)-amino]-9,9-spirobifluorene (spiro-2NPB), tris(3-methylphenylphenylamino)-triphenylamine (m-MTDATA), dipyrazino [2,3-f:2',3'-h]quinoxaline-2,3,6,7,10,11-hexacarbonitrile (HAT-CN), di-[4-(N,N-di-p-tolyl-amino)-phenyl]cyclohexane (TAPC), N,N'-(4,4'-(cyclohexane-1,1-diyl)bis(4,1-phenylene))bis(N-(4-(6-(2-ethyloxetan-2-yl oxy)hexyl)phenyl)-3,4,5-trifluoroaniline) (X-F6-TAPC), 4,4'-bis(N-carbazolyl)-1,1'-biphenyl (CBP), 2,6-bis(3-(9H-carbazol-9-yl)phenyl)pyridine (26DCzPPy), or a combination thereof.

In another embodiment, the p-type organic semiconductor 141b may be, for example, included in an amount of less than or equal to about 1 wt %, less than or equal to about 0.9 wt %, less than or equal to about 0.8 wt %, less than or equal to about 0.7 wt %, less than or equal to about 0.6 wt %, or less than or equal to about 0.5 wt %, and for example greater than 0 wt %, greater than or equal to about 0.1 wt %, or greater than or equal to about 0.2 wt %, or for example greater than 0 wt % and less than or equal to about 1 wt %, greater than 0 wt % and less than or equal to about 0.9 wt %, greater than 0 wt % and less than or equal to about 0.8 wt %, greater than 0 wt % and less than or equal to about 0.7 wt %, greater than 0 wt % and less than or equal to about 0.6 wt %, or greater than 0 wt % and less than or equal to about 0.5 wt % based on a total weight of the first light emitting layer 141 and thus may allow the first light emitting layer 141 to exhibit the hole transport characteristics and/or electron blocking characteristics.

Referring to FIG. 3, different ligands 14a and 14b may be attached to the surface of the first quantum dots 141a. In another embodiment, the different types of ligands 14a and 14b may include the aforementioned hydrophobic ligand 14a and a compound 14b derived from a metal halide. Alternatively, only the compound 14b derived from the metal halide may be attached to the surface of the first quantum dots 141a.

The types and amounts of the hydrophobic ligand 14a and the compound 14b derived from the metal halide attached to the first quantum dots 141a may be controlled by the following method.

For example, the first light emitting layer 141 may be formed by a process of coating and drying a solution for forming a first light emitting layer including first quantum dots 141a to which hydrophobic ligands 14a are attached, and then adding a solution including a metal halide therein, for example in a dropwise fashion. During the addition in a dropwise fashion of the solution including the metal halide, at least a portion of the hydrophobic ligands 14a attached to the first quantum dots 141a may be replaced (or substituted) with the ligand derived from a compound 14b including a metal halide having a relatively stronger chemical bond with the surface of the first quantum dots 141, which is specifically a halogen ion moiety.

An amount of the hydrophobic ligand 14a relative to an amount of the ligand derived from a compound 14b including the metal halide which are bound to the first quantum dots 141a may be varied depending on a concentration of the metal halide in the solution including the metal halide, and an addition time and a reaction time of the solution including the metal halide, which is generally added as a dropwise fashion.

However, from the viewpoint of improving driving characteristics and charge injection characteristics of the first light emitting layer 141, an amount of the ligands derived from the compound including the metal halide 14b relative to the total amount of the ligands attached to the surface of the first quantum dots 141a may be greater than or equal to about 10 weight % (wt %), greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, or greater than or equal to about 20 wt % and, for example, less than or equal to about 40 wt %, less than or equal to about 39 wt %, less than or equal to about 38 wt %, less than or equal to about 37 wt %, less than or equal to about 36 wt %, less than or equal to about 35 wt %, less than or equal to about 34 wt %, less than or equal to about 33 wt %, less than or equal to about 32 wt %, less than or equal to about 31 wt %, or less than or equal to about 30 wt %, or, for example, from about 10 wt % to about 40 wt %, from about 10 wt % to about 35 mol %, or from about 10 wt % to about 30 wt %.

Because the hydrophobic ligand 14a generally has a larger volume than the ligand derived from a compound 14b including metal halide, as a weight amount of replacement (or substitution) of the hydrophobic ligand 14a bound to the surface of the first quantum dots 141a relative to the compound 14b including metal halide increases, voids, cracks, and the like, inside the first light emitting layer 141 may increase.

However, after the addition in a dropwise fashion and reaction of the solution including the metal halide are completed, the electroluminescent device 10 according to another embodiment effectively fills voids, cracks, and the like inside of the first light emitting layer 141 by adding a solution including the p-type organic semiconductor 141b. Accordingly, the p-type organic semiconductor 141b may be disposed to fill at least a portion of the empty space generated during ligand replacement (or substitution) of the aforementioned first quantum dots 141a.

The p-type organic semiconductor 141b according to another embodiment may desirably include a p-type monomolecular organic semiconductor so as to effectively fill the empty space. However, another embodiment is not necessarily limited.

As described above, the electroluminescent device 10' according to another embodiment is configured as a dual layer of the first and second light emitting layers 141 and 142, and electron-hole balance may be improved upon by the presence of the p-type organic semiconductors 141b included in the first light emitting layer 141 and the n-type organic semiconductors 142b included in the second light emitting layer 142. A p-n junction is configured in the light emitting layer 140, and thereby an electron-hole recombination position may be adjusted in the p-n junction surface or near the surface in the light emitting layer 140. As a result, the electroluminescent device 10 may exhibit improved luminous efficiency and life-span characteristics.

Hereinafter, a display device including the aforementioned electroluminescent devices 10 and 10' is described.

A display device according to an embodiment includes a substrate, a driving circuit formed on the substrate, and a first electroluminescent device, a second electroluminescent device, and a third electroluminescent device spaced apart from each other in a predetermined interval and disposed on the driving circuit.

The first to third electroluminescent devices have the same structure as the aforementioned electroluminescent device 10, but the wavelengths of the lights emitted from each quantum dots may be different from each other.

In an embodiment, the first electroluminescent device may be a red device emitting red light, the second electroluminescent device may be a green device emitting green light, and the third electroluminescent device may be a blue device emitting blue light. In other words, the first to third electroluminescent devices may be pixels expressing red, green, and blue, respectively, in the display device.

However, an embodiment is not necessarily limited thereto, but the first to third electroluminescent devices may respectively express magenta, yellow, cyan, or may express other colors.

Only one of the first to third electroluminescent devices may be the aforementioned electroluminescent device 10. In this case, the third electroluminescent device displaying at least blue may be the aforementioned electroluminescent device 10.

In the display device according to an embodiment, a hole injection layer, a hole transport layer, an electron transport layer, an electron injection layer, and a hole blocking layer may be integrated to form a common layer, except for the light emitting layer of each pixel. However, an embodiment is not limited thereto. A hole injection layer, a hole transport layer, an electron transport layer, an electron injection layer, and a hole blocking layer may be independently formed in each pixel of the display device, or at least one of a hole injection layer, a hole transport layer, an electron transport layer, an electron injection layer, and a hole blocking layer may form a common layer and remaining layers may form a separate independent layer.

The substrate may be a transparent insulating substrate or may be made of a ductile material. The substrate may include glass or a polymer material in a film having a glass transition temperature ($T_g$) of greater than about 150° C. For example, it includes a COC (cycloolefin copolymer) or COP (cycloolefin polymer) based material. All the aforementioned first to third electroluminescent devices are formed on the substrate. That is, a substrate of the display device according to an embodiment provides a common layer.

The driving circuit is disposed on the substrate and is independently connected to each of the first to third electroluminescent devices. The driving circuit may include at least one line including a scan line, a data line, a driving power source line, a common power source line, and the like, at least two of thin film transistors (TFT) connected to the wire and corresponding to one organic light emitting diode, and at least one capacitor, or the like. The driving circuit may have a variety of the known structures.

As described above, the display device according to the embodiment exhibits improved device light emitting efficiency as well as improved life-span and luminous efficiency.

Hereinafter, the embodiments are illustrated in more detail with reference to examples. However, these examples are exemplary, and the present disclosure is not limited thereto.

Example 1

A hole injection layer having a thickness of 30 nm to 40 nm is formed by surface-treating a glass substrate deposited with ITO (a work function: −4.850 eV), a first electrode (an anode), with a UV-ozone for 15 minutes and then, spin-coating a PEDOT:PSS solution (an HOMO energy level: −5.35 eV, a LUMO energy level: −2.75 eV, H.C. Starks Inc.) and heat-treating it at 150° C. for 30 minutes under a nitrogen atmosphere.

Subsequently, on the hole injection layer, a 25 nm-thick hole transport layer is formed by spin-coating a solution prepared by dissolving poly[(9,9-dioctylfluorenyl-2,7-diyl-co(4,4'-(N-4-butylphenyl)diphenylamine] (TFB, an HOMO energy level: −5.56 eV, a LUMO energy level: −2.69 eV, Sumitomo Corp.) in toluene and then, heat-treating it at 150° C. for 30 minutes.

Subsequently, 150 mg of ZnTeSe/ZnSe core-shell blue quantum dots to which oleate as a hydrophobic ligand is attached on the surface (an average particle diameter: 11 nm to 13 nm, a peak wavelength: about 453 nm) are put into 10 mL of octane, and then, stirred for 5 minutes to prepare a composition for a first blue light emitting layer. Then, the composition for a first blue light emitting layer is spin-coated on a hole transport layer and heat-treated at 80° C. for 30 minutes under a nitrogen atmosphere to form a 28 nm-thick first blue light emitting layer. Subsequently, on the first blue light emitting layer, an ethanol solution of zinc chloride (a concentration: 10 mg/mL) is added thereto in a dropwise fashion, and then, reacted therewith for 1 minute to substitute the oleate attached to the quantum dot of the first blue light emitting layer with chloride (a chloride substitution amount out of the total ligands attached to the surface of the quantum dot: 10 mol % to 40 mol %). Then, the first blue light emitting layer is dried at 120° C. for 30 minutes under a vacuum condition.

For the preparation of a second emitting layer 15 mg/mL of a ZnTeSe/ZnS core-shell blue quantum dots to which oleate as a hydrophobic ligand is attached on the surface (an average particle diameter: 11 nm to 13 nm, a peak wavelength: about 453 nm) and 10 mg/mL of zinc chloride are put into 10 mL of octane, and then, reacted therewith at 60° C. to 80° C. for 120 minutes to substitute a portion of the attached ligand with chloride (a chloride substitution amount out of the total ligands attached to the surface of the quantum dot: 5 mol % to 8 mol %). Then, 1 mg/mL of 1,3,5-tri(diphenylphosphoryl-pen-3-yl) benzene (TP3PO, an HOMO energy level: −7.33 eV, a LUMO energy level: −2.85 eV, Lumtec Corp.) is added thereto, and stirred to prepare a composition for the second blue light emitting layer.

On the first blue light emitting layer, the composition for a second blue light emitting layer is spin-coated, and heat-treated at 80° C. for 30 minutes to form a 13 nm-thick second blue light emitting layer (a TP3PO content in the second blue light emitting layer: 0.1 wt %)

Subsequently, on the second blue light emitting layer, a solution for forming an electron transport layer in which ZnMgO (an average particle diameter: 3 nm, an HOMO energy level: −7.6 eV, a LUMO energy level: −4.3 eV) is dispersed in ethanol is spin-coated and heat-treated at 80° C. for 30 minutes to form an electron transport layer having a thickness of 20 nm to 25 nm.

Subsequently, on the electron transport layer, aluminum (a work function: −4.3 eV) is vacuum-deposited to be 100 nm thick to form a second electrode. The electroluminescent device according to Example 1 is summarized as follows: [ITO/PEDOT:PSS/TFB/Blue QD/Blue QD: TP3PO (0.1 wt %)/ZnMgO/Al].

Example 2

An electroluminescent device [ITO/PEDOT:PSS/TFB/Blue QD/Blue QD: POT2T (0.1 wt %)/ZnMgO/Al] according to Example 2 is produced according to the same method as Example 1, except that 1,3,5-triazine-2,4,6-triyl)tris(benzene-3,1-diyl)tris(diphenylphosphine oxide) (POT2T, an HOMO energy level: −7.35 eV, a LUMO energy level: −2.88 eV, Lumtec Corp.) is used instead of TP3PO.

Example 3

An electroluminescent device [ITO/PEDOT:PSS/TFB/Blue QD/Blue QD: TP3PO (0.2 wt %)/ZnMgO/Al] according to Example 3 is produced according to the same method as Example 1, except that the TP3PO content in the composition for a second blue light emitting layer is adjusted to have 0.2 wt % of the TP3PO content in the second blue light emitting layer.

Example 4

An electroluminescent device [ITO/PEDOT:PSS/TFB/Blue QD/Blue QD: POT2T (0.2 wt %)/ZnMgO/Al] according to Example 4 is produced according to the same method as Example 2, except that the POT2T content in the composition for a second blue light emitting layer is adjusted to have 0.2 wt % of the POT2T content in the second blue light emitting layer.

Comparative Example 1

An electroluminescent device [ITO/PEDOT:PSS/TFB/Blue QD/Blue QD/ZnMgO/Al] is produced according to the same method as Example 1, except that the second blue light emitting layer does not include the separate n-type organic semiconductors (TP3PO and/or POT2T).

Evaluation 1: Luminance and Life-Span Characteristics of Electroluminescent Device Having Dual Light Emitting Layers Including n-Type Organic Semiconductor Luminance characteristics of the electroluminescent devices according to Examples 1 to 4 and comparative example are respectively evaluated, and the results are shown in Table 1A and Table 1B.

TABLE 1A

|  | Maximum EQE [%] | Maximum luminance [cd/m$^2$] | EQE at 1000 nt [%] | EQE at 2000 nt [%] | EQE at 10000 nt [%] | Maximum luminous efficiency [Cd/A] |
|---|---|---|---|---|---|---|
| Ex. 1 | 8.5 | 23010 | 8.4 | 7.9 | 4.7 | 7.0 |
| Ex. 2 | 8.8 | 26470 | 8.8 | 8.5 | 5.1 | 7.0 |
| Ex. 3 | 6.7 | 23660 | 6.4 | 6.1 | 4.2 | 5.7 |
| Ex. 4 | 6.7 | 26140 | 6.5 | 6.7 | 4.7 | 5.3 |
| Comp. Ex. 1 | 6.4 | 28260 | 4.8 | 5.4 | 3.7 | 4.4 |

TABLE 1B

|  | Driving voltage at 5 mA [V] | Luminance at 5 mA [Cd/m$^2$] | Driving voltage at 1000 nt [V] | Peak emission wavelength [nm] | FWHM [nm] | CIE x | CIE y |
|---|---|---|---|---|---|---|---|
| Ex. 1 | 3.6 | 348 | 3.8 | 454 | 25 | 0.1482 | 0.0791 |
| Ex. 2 | 3.4 | 347 | 3.6 | 453 | 25 | 0.1479 | 0.0804 |
| Ex. 3 | 3.5 | 278 | 3.7 | 454 | 25 | 0.1474 | 0.0803 |

TABLE 1B-continued

|  | Driving voltage at 5 mA [V] | Luminance at 5 mA [Cd/m$^2$] | Driving voltage at 1000 nt [V] | Peak emission wavelength [nm] | FWHM [nm] | CIE x | CIE y |
|---|---|---|---|---|---|---|---|
| Ex. 4 | 3.2 | 265 | 3.6 | 454 | 26 | 0.1472 | 0.0829 |
| Comp. Ex. 1 | 4.0 | 73 | 4.4 | 453 | 23 | 0.1490 | 0.0680 |

Referring to Tables 1A and 1B, the electroluminescent devices according to the Examples all exhibit excellent luminance, and particularly, excellent external quantum efficiency in a range from 1000 nits and including a luminance of greater than or equal to 10,000 nits (nit=cd/cm$^2$) compared with that of comparative example. All Examples also exhibit a reduction in drive voltage in a range from 1000 to 10000 nits. Moreover, the Examples exhibit such light emitting properties with little or no change in the peak emission wavelength of the full width half maximum (FWHM).

The electroluminescent devices of the Examples may exhibit different luminance characteristics depending on types of n-type organic semiconductors.

First, Example 2 including POT2T exhibits a slight improvement in luminance vs. EQE characteristics compared with Example 1 including TP3PO. We believe that the observed difference between POT2T and TP3PO may result from a slightly greater electron mobility in POT2T relative to that of TP3PO.

The electroluminescent devices according to the Examples may exhibit different luminance characteristics depending on the amount (or concentration in weight percent) of the n-type organic semiconductor.

Figure 4:
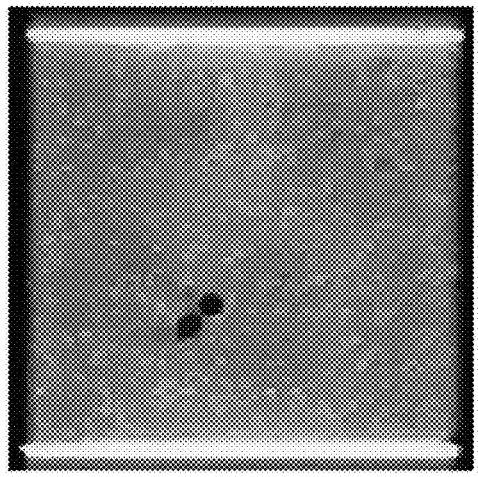
FIG. 4 is an image of from an electroluminescent device at luminance of 1 Cd/A according to comparative example.
Figure 5:
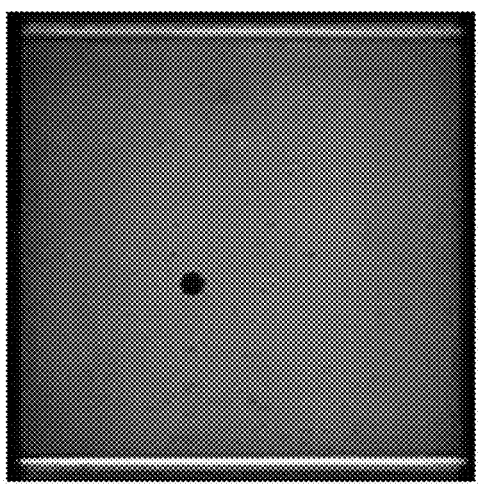
FIG. 5 is an image of from an electroluminescent device at luminance of 1 Cd/A according to Example 1.
Figure 6:
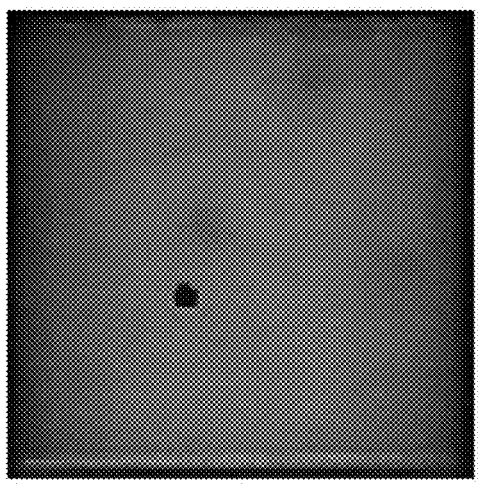
FIG. 6 is an image of from an electroluminescent device at luminance of 1 Cd/A according to Example 2.

When the same n-type organic semiconductor is used, but at different concentrations (e.g., Example 1 vs. Example 3 and/or Example 2 vs. Example 4), Examples 1 and 2 including 0.1 wt % of the n-type organic semiconductor exhibit greater luminance vs. external quantum efficiency. The images of the electroluminescent devices of comparative example and Examples 1 to 2 at 1 candela per ampere (Cd/A) are respectively shown in FIGS. 4, 5, and 6. FIGS. 4, 5, and 6 show images at luminance of 1 Cd/A of the electroluminescent devices according to comparative example (FIG. 4), Example 1 (FIG. 5), and Example 2 (FIG. 6), respectively.

Referring to FIG. 4, both ends (where a patterned ITO electrode is positioned and having a predetermined step with the other regions, and thus, a different thickness) of the electroluminescent device for the comparative example emit more uniform light and appear relatively bright (white) compared with other regions of the device that emit light that is not relatively uniform. The results indicate that for the electroluminescent device of Comparative Example, light emission primarily occurs at both of the ends of the device where electrons are injected because an electron-hole balance is absent in the overall device structure, and thus, the electron-hole injection into the light emitting layer is less consistent (uniform) throughout the layer.

In contrast, the electroluminescent devices according to Examples 1 and 2 embodiments, as shown in FIGS. 5 and 6, respectively, exhibit relatively consistent or uniform light emission over the entire device. Accordingly, the electroluminescent devices according to the Example embodiments provide a significantly greater electron-hole balance in the device, and accordingly, electrons-holes are more consistently injected into the light emitting layers resulting in a more uniform light emission.

The life-span characteristics of the electroluminescent devices of Examples 1 to 2 and comparative example are evaluated, and the results are shown in Table 2. The results show far superior device stability for both Examples 1 and 2 over the comparative example (again, with no n-type semiconductor present in the second emitting layer.

TABLE 2

|  | T95 [h] | T50 [h] | Current [mA] | Initial P. current [µA] |
|---|---|---|---|---|
| Example 1 | 6.59 | 40.2 | 0.326 | 2.967 |
| Example 2 | 7.43 | 54.9 | 0.333 | 2.837 |
| Comparative Example | 2.50 | 22.1 | 0.301 | 3.008 |

In Table 2, the values of T95 and T50, respectively, indicate the amount of time it takes in hours for initial luminance of the device to decrease to 95% (T95) and 50% (T50) of the initial luminance value. Referring to the data reported in Table 2, the electroluminescent devices of Examples exhibit significantly greater life-span characteristics compared to the comparative example.

In Table 2, an initial photocurrent (P. current) is a current obtained by converting emitted light from a device with a light-receiving sensor (a photodiode), and indicates the intensity of the emitted light from the device. In other words, the initial P. current indicates that the electroluminescent devices of Examples and comparative example each exhibit near equivalent light intensities at $T_0$, which further supports the significant improvements in the lifetime values of Example 1 and 2 Example 5

A hole injection layer having a thickness of 30 nm to 40 nm is formed by surface-treating a glass substrate deposited with ITO (work function: −4.850 eV), a first electrode (an anode), with a UV-ozone for 15 minutes, spin-coating a PEDOT:PSS solution (HOMO energy level: −5.35 eV, LUMO energy level: −2.75 eV, H.C. Starks Inc.), and then, heat-treating the same at 150° C. for 30 minutes under a nitrogen atmosphere.

Subsequently, on the hole injection layer, a 25 nm-thick hole transport layer is formed by spin-coating a solution prepared by dissolving poly[(9,9-dioctylfluorenyl-2,7-diyl-co(4,4'-(N-4-butylphenyl)diphenylamine] (TFB, HOMO energy level: −5.56 eV, LUMO energy level: −2.69 eV, Sumitomo Corp.) in toluene, and then, heat-treating it at 150° C. for 30 minutes.

Subsequently, 150 mg of a ZnTeSe/ZnSe core-shell blue quantum dots to which oleate as a hydrophobic ligand is attached on the surface (an average particle diameter: 11 nm to 13 nm, a peak wavelength: about 453 nm) is put into 10 mL of octane, and then, stirred for 5 minutes to prepare a composition for a first blue light emitting layer intermediate. The composition for a first blue light emitting layer intermediate is spin-coated on the hole transport layer (HTL) and heat-treated at 80° C. for 30 minutes under a nitrogen atmosphere to form a 28 nm-thick first blue light emitting layer intermediate.

Subsequently, an ethanol solution of zinc chloride (a concentration: 10 mg/mL) is added in a dropwise fashion to the first blue light emitting layer intermediate and then, reacted therewith for 1 minute to substitute the oleate attached to the quantum dot of the first blue light emitting layer with chloride (a chloride substitution amount out of the total ligands attached to the surface of the quantum dot: 10% to 40%).

On the first blue light emitting layer intermediate, a solution containing N,N'-bis(3-methylphenyl)-N,N'-diphenylbenzidine (TPD, an HOMO energy level: −5.56 eV, a LUMO energy level: −2.69 eV, Sumitomo Corp.) is added in a dropwise fashion to fill the surface and an inner space of the first blue light emitting layer intermediate generated by the chloride substitution, and then, dried at 80° C. for 30 minutes under a vacuum condition to complete a first blue light emitting layer (a TPD content in the first blue light emitting layer: 0.3 wt %).

For the preparation of the second light emitting layer, 150 mg of a ZnTeSe/ZnSe core-shell blue quantum dots to which oleate as a hydrophobic ligand is attached on the surface (an average particle diameter: 11 nm to 13 nm, a peak wavelength: about 453 nm) and 10 mg/mL of zinc chloride are added to 10 mL of octane, and then, reacted therewith at 60° C. to 80° C. for 120 minutes to substitute chloride for a portion of the attached ligand (a chloride substitution amount out of the total ligands attached to the surface of the quantum dot: 5 to 8%). Subsequently, 1 mg/mL of TP3PO (an HOMO energy level: −7.33 eV, a LUMO energy level: −2.85 eV, Lumtec Corp.) is added and stirred to prepare a composition for the second blue light emitting layer.

On the first blue light emitting layer, the composition for a second blue light emitting layer is spin-coated, and then, heat-treated at 80° C. for 30 minutes for a nitrogen atmosphere to form a 13 nm-thick second blue light emitting layer (a TP3PO content in the second blue light emitting layer: 0.1 wt %).

Subsequently, on the second blue light emitting layer, a solution for an electron transport layer in which ZnMgO (an average particle diameter: 3 nm, an HOMO energy level: −7.6 eV, a LUMO energy level: −4.3 eV) is dispersed in ethanol is spin-coated, and then, heat-treated at 80° C. for 30 minutes to form a 20 nm to 25 nm-thick electron transport layer (ETL).

On the electron transport layer (ETL), aluminum (a work function: −4.3 eV) is vacuum-deposited to be a 100 nm-thick second electrode. The electroluminescent device according to Example 5 is summarized as follows: [ITO/PEDOT:PSS/TFB/Blue QD:TPD (0.3 wt %)/Blue QD:TP3PO (0.1 wt %)/ZnMgO/Al].

Evaluation 2: Luminance and Life-Span Characteristics of Electroluminescent Device Having p-n Junction Luminance and life-span characteristics of the electroluminescent devices of Example 5 and comparative example are evaluated, and the results are shown in Table 3A and Table 3B.

TABLE 3

|  | Maximum EQE [%] | Maximum luminance [cd/m$^2$] | EQE at 1000 nt [%] | EQE at 2000 nt [%] | EQE at 10000 nt [%] | Maximum luminous efficiency [Cd/A] |
|---|---|---|---|---|---|---|
| Ex. 5 | 9.8 | 34310 | 8.8 | 9.2 | 4.9 | 6.9 |
| Comp. Ex. | 6.4 | 28260 | 4.8 | 5.4 | 3.7 | 4.4 |

TABLE 3B

|  | Driving voltage at 5 mA [V] | Luminance at 5 mA [Cd/m$^2$] | Driving voltage at 1000 nt [V] | Peak emission wavelength [nm] | FWHM [nm] | CIE x | CIE y |
|---|---|---|---|---|---|---|---|
| Ex. 5 | 1.4 | 0 | 3.8 | 453 | 23 | 0.1490 | 0.0762 |
| Comp. Ex. 1 | 4.0 | 73 | 4.4 | 453 | 23 | 0.1490 | 0.0680 |

Referring to Table 3A and 3B, the electroluminescent device of Example 5 exhibits an improved maximum luminance, an improved luminance at 1,000 nits (about 80% greater), an improved luminance at 2,000 nits (about 80% greater), and an improved luminance at 10,000 nits (about 25% greater), compared to the comparative example. In addition, Example 5 exhibits a further improvement in maximum luminance and maximum external quantum efficiency compared to Examples 1 to 4.

The life-span characteristics of the electroluminescent devices according to Example 5 and the comparative example are evaluated, and the results are shown in Table 4.

TABLE 4

|  | T95 [h] | T50 [h] | Current [mA] | Initial P. current [μA] |
|---|---|---|---|---|
| Example 5 | 10.82 | 62.4 | 0.379 | 2.824 |
| comparative example | 2.50 | 22.1 | 0.301 | 3.008 |

Referring to Table 4, the electroluminescent device of Example 5 having a dual light emitting layer including p-n junctions exhibits excellent life-span characteristics compared with that of comparative example. For instance, the device of Example 5 shows greater than a 400% increase in T95 lifetime and a near 300% increase in T50 lifetime. In addition, when the p-n junctions are formed in a dual light emitting layer as in Example 5, the life-span characteristics may be further improved upon, See, comparison of lifetime with Examples 1 to 4.

| Description of Symbols | |
| --- | --- |
| 10: electroluminescent device | 100: substrate |
| 110: first electrode | 120: hole injection layer |
| 130: hole transport layer | 140: light emitting layer |
| 141: first light emitting layer | 141a: first quantum dot |
| 141b: p-type organic semiconductor | 142: second light emitting layer |
| 142a: second quantum dot | 142b: n-type organic semiconductor |
| 150: electron transport layer | 160: second electrode |

What is claimed is:

1. An electroluminescent device, comprising
a first electrode;
a hole transport layer disposed on the first electrode;
a light emitting layer comprising a first light emitting layer disposed on the hole transport layer, the first light emitting layer comprising a first quantum dot, and a second light emitting layer comprising a second quantum dot and an n-type organic semiconductor, the second light emitting layer disposed on the first light emitting layer;
an electron transport layer disposed on the second light emitting layer; and
a second electrode disposed on the electron transport layer.

2. The electroluminescent device of claim 1, wherein a highest occupied molecular orbital energy level of the n-type organic semiconductor is less than or equal to about −7.0 eV.

3. The electroluminescent device of claim 1, wherein the n-type organic semiconductor comprises an n-type monomolecular organic semiconductor, an n-type polymer organic semiconductor, or a combination thereof.

4. The electroluminescent device of claim 3, wherein the n-type monomolecular organic semiconductor comprises 1,3,5-tri(diphenylphosphoryl-phen-3-yl) benzene, 1,3,5-triazine-2,4,6-triyl)tris(benzene-3,1-diyl)tris(diphenylphosphine oxide), diphenylbis(4-(pyridin-3-yl)phenyl)silane, 3-(4-biphenyl)-4-phenyl-5-tert-butylphenyl-1,2,4-triazole, 4-(naphthalen-1-yl)-3,5-diphenyl-4H-1,2,4-triazole, 1,3,5-tris(1-phenyl-1Hbenzimidazol-2-yl)benzene, 4,7-diphenyl-1,10-phenanthroline, 1,3-bis[2-(2,2'-bipyridin-6-yl)-1,3,4-oxadiazol-5-yl]benzene, 2-(4-biphenyl)-5-(4-tert-butylphenyl)-1,3,4-oxadiazole, bathocuproine, 4,4'-bis(carbazol-9-yl)-2,2'-dimethylbiphenyl, tris[3-(3-pyridyl)-mesityl]borane, or a combination thereof.

5. The electroluminescent device of claim 1, wherein the n-type organic semiconductor is present in an amount of greater than 0 weight percent and less than or equal to about 0.5 weight percent based on a total weight of the second light emitting layer.

6. The electroluminescent device of claim 1, wherein the first light emitting layer further comprises a p-type organic semiconductor.

7. The electroluminescent device of claim 6, wherein a lowest unoccupied molecular orbital energy level of the p-type organic semiconductor is greater than or equal to about −3.0 eV.

8. The electroluminescent device of claim 6, wherein the p-type organic semiconductor comprises a p-type monomolecular organic semiconductor.

9. The electroluminescent device of claim 8, wherein the p-type monomolecular organic semiconductor comprises tris(4-carbazol-9-yl phenyl)amine, N,N'-bis(3-methylphenyl)-N,N'-diphenylbenzidine, N,N'-bis(3-methylphenyl)-N,N'-bis(phenyl)-2,7-diamino-9,9-spirobifluorene, N,N'-bis(3-methylphenyl)-N,N'-bis(phenyl)-9,9-dioctylfluorene, N,N'-bis(3-methylphenyl)-N,N'-bis(phenyl)-2,7-diamino-9,9-diphenyl-fluorene, N,N'-bis(3-methylphenyl)-N,N'-bis(phenyl)-2,7-diamino-9,9-dimethyl-fluorene, N1,N1'-(biphenyl-4,4'-diyl)bis(N1-phenyl-N4,N4-di-m-tolylbenzene-1,4-diamine), N,N,N',N'-tetra-(3-methylphenyl)-3,3'-dimethylbenzidine (HMTPD), N,N'-di(naphthalen-1-yl)-N—N'-diphenyl-benzidine (NPB), N2,N7-di(naphthalen-1-yl)-9,9-dioctyl-N2,N7-diphenyl-9H-fluorene-2,7-diamine, N,N'-bis(naphthalen-1-yl)-N,N'-bis(phenyl)-2,7-diamino-9,9-spirobifluorene, 2,2',7,7'-tetrakis[N-naphthalenyl(phenyl)-amino]-9,9-spirobifluorene, tris(3-methylphenylphenylamino)-triphenylamine, dipyrazino[2,3-f:2',3'-h]quinoxaline-2,3,6,7,10,11-hexacarbonitrile, di-[4-(N,N-di-p-tolyl-amino)-phenyl]cyclohexane, N,N'-(4,4'-(cyclohexane-1,1-diyl)bis(4,1-phenylene))bis(N-(4-(6-(2-ethyloxetan-2-yloxy)hexyl)phenyl)-3,4,5-trifluoroaniline), 4,4'-bis(N-carbazolyl)-1,1'-biphenyl, 2,6-bis(3-(9H-carbazol-9-yl)phenyl)pyridine, or a combination thereof.

10. The electroluminescent device of claim 6, wherein the p-type organic semiconductor is present in an amount of greater than 0 weight percent and less than or equal to about 1 weight percent based on a total weight of the first light emitting layer.

11. The electroluminescent device of claim 1, wherein the light emitting layer has a thickness of about 10 nanometers to about 60 nanometers.

12. The electroluminescent device of claim 1, wherein at least one of the first quantum dot or the second quantum dot comprises a core comprising a first semiconductor nanocrystal and a shell disposed on the core, the shell comprising a second semiconductor nanocrystal, wherein the second semiconductor nanocrystal has a composition different from the first semiconductor nanocrystal.

13. The electroluminescent device of claim 12, wherein the first semiconductor nanocrystal and the second semiconductor nanocrystal independently comprise a Group II-VI compound that does not comprise Cd, a Group III-V compound, a Group IV-VI compound, a Group IV element or compound, a Group I-III-VI compound, a Group I-II-IV-VI compound that does not comprise Cd, or a combination thereof.

14. The electroluminescent device of claim 1, wherein a ligand derived from a compound comprising a metal halide, a compound comprising a carboxylic acid, a compound comprising a thiol, or a combination thereof, is attached to a surface of at least one of the first quantum dot or the second quantum dot.

15. The electroluminescent device of claim 14, wherein the surface of the first quantum dot comprises the ligands derived from the compound comprising the metal halide and additional ligands,
wherein a weight of the ligand derived from the compound comprising the metal halide relative of a total weight of ligands attached to the surface of the first quantum dot is about 10 percent to about 40 percent.

16. The electroluminescent device of claim 14, wherein the surface of the second quantum dot comprises
the ligand derived from a compound comprising the carboxylic acid, the compound comprising a thiol, or a combination thereof,
wherein a weight of the ligand derived from the compound comprising the carboxylic acid, the compound comprising the thiol, or a combination thereof relative to total weight of ligands attached to the surface of the second quantum dot is greater than or equal to about 80 percent.

17. The electroluminescent device of claim 1, wherein the hole transport layer comprises a poly(3,4-ethylenedioxythiophene) derivative, a poly(styrenesulfonate) derivative, a poly-N-vinylcarbazole derivative, a polyphenylenevinylene derivative, a polyparaphenylenevinylene derivative, a polymethacrylate derivative, a polyarylamine derivative, a polyaniline derivative, a polypyrrole derivative, a poly(9,9-dioctylfluorene) derivative, a poly(spiro-bifluorene) derivative, a tris(4-carbazol-9-yl phenyl)amine, N,N'-diphenyl-N,N'-bis(3-methylphenyl)-(1,1'-biphenyl)-4,4'-diamine, N,N'-di(naphthalen-1-yl)-N—N'-diphenyl-benzidine, tris(3-methylphenylphenylamino)-triphenylamine, poly(N,N'-diphenyl-N,N'-bis(3-methylphenyl)-(1,1'-biphenyl)-4,4'-diamine), NiO, $MoO_3$, or a combination thereof.

18. The electroluminescent device of claim 1, wherein the electron transport layer comprises inorganic nanoparticles, a quinolone compound, a triazine-containing compound, a quinoline-containing compound, a triazole-containing compound, a naphthalene-containing compound, or a combination thereof.

19. The electroluminescent device of claim 18, wherein the electron transport layer comprises a plurality of inorganic nanoparticles.

20. A display device comprising the electroluminescent device of claim 1.

21. A stack for an electroluminescent device comprising a light emitting layer, the stack comprising
a first light emitting layer disposed on a hole transport layer, and
a second light emitting layer adjacent to the first light emitting layer and disposed on an electron transport layer,
wherein the first light emitting layer comprises a first quantum dot, and the second light emitting layer comprises a second quantum dot and an n-type organic semiconductor.

22. The stack for an electroluminescent device of claim 21, wherein
the first light emitting layer further comprises a p-type organic semiconductor, and
wherein a highest occupied molecular orbital energy level of the n-type organic semiconductor is less than or equal to about −7.0 eV, and a lowest unoccupied molecular orbital energy level of the p-type organic semiconductor is greater than or equal to about −3.0 eV.

23. The stack for an electroluminescent device of claim 21, wherein the first light emitting layer and the second light emitting layer emit light with the same or different wavelength, the wavelengths being a range from 380 nanometers to 488 nm.

24. The stack for an electroluminescent device of claim 21, wherein
a surface of the first quantum dot comprises a ligand derived from a compound comprising a metal halide, and a ligand derived from a compound comprising a carboxylic acid, a compound comprising a thiol, or a combination thereof, and
a weight of the ligand derived from the compound comprising the metal halide to a total amount of the ligands attached to the surface of the first quantum dot is about 10 percent to about 40 percent; and
a surface of the second quantum dot comprises a ligand derived from a compound comprising a carboxylic acid, a compound comprising a thiol, or a combination thereof, and
a weight of the ligand derived from the compound comprising the carboxylic acid, the compound comprising the thiol, or a combination thereof, to a total amount of the ligands attached to the surface of the second quantum dot is greater than or equal to about 80 percent.

* * * * *